United States Patent
Buckley

(10) Patent No.: US 9,026,405 B2
(45) Date of Patent: May 5, 2015

(54) SYSTEMS AND METHODS FOR HOME ENERGY AUDITING

(75) Inventor: Neil F. Buckley, Foster City, CA (US)

(73) Assignee: Solarcity Corporation, San Mateo, CA (US)

( * ) Notice: Subject to any disclaimer, the term of this patent is extended or adjusted under 35 U.S.C. 154(b) by 438 days.

(21) Appl. No.: 13/433,191

(22) Filed: Mar. 28, 2012

(65) Prior Publication Data

US 2013/0262040 A1    Oct. 3, 2013

(51) Int. Cl.
G06F 17/50    (2006.01)
G06Q 50/06    (2012.01)

(52) U.S. Cl.
CPC ............ *G06Q 50/06* (2013.01); *G06F 17/5004* (2013.01)

(58) Field of Classification Search
CPC ...... G06F 17/50; G06F 17/5004; G06Q 50/06
USPC .......................................................... 703/1
See application file for complete search history.

(56) References Cited

U.S. PATENT DOCUMENTS

| | | | | |
|---|---|---|---|---|
| 6,956,500 | B1 * | 10/2005 | Ducharme et al. | 340/870.02 |
| 6,968,295 | B1 * | 11/2005 | Carr | 702/188 |
| 8,285,603 | B2 * | 10/2012 | Carlin et al. | 705/26.7 |
| 8,494,922 | B2 * | 7/2013 | Carlin et al. | 705/26.7 |
| 8,543,343 | B2 * | 9/2013 | Jones et al. | 702/60 |
| 2009/0307573 | A1 * | 12/2009 | Lavelle et al. | 715/205 |
| 2010/0223081 | A1 * | 9/2010 | Espino, Jr. | 705/7 |
| 2011/0015798 | A1 * | 1/2011 | Golden et al. | 700/291 |
| 2013/0275174 | A1 * | 10/2013 | Bennett et al. | 705/7.23 |

OTHER PUBLICATIONS

Osello, Anna, et al. "Architecture data and energy efficiency simulations: BIM and interoperability standards." proceedings of Building Simulation. 2011.*
Yin, Xuetao, Peter Wonka, and Anshuman Razdan. "Generating 3d building models from architectural drawings: A survey." IEEE Computer Graphics and Applications 29.1 (2009): 20-30.*
Ecotect Analysis Brochure—Sustainable Building Design Software—Autodesk 2010.*
Ecotect guide by Square One, 2008.*
"EnergyPlus—The Most Powerful Predictor of a Building's Energy Efficiency"; EnergyPlus Copyright 1996-2010; The Board of Trustees of the University of Illinois and The Regents of the University of California through the Ernest Orlando Lawrence Berkeley National Laboratory; 1 page.
"Recurve Software—Powering Home Energy Professionals"; 2011 Recurve, Inc.; 4 pages.

(Continued)

*Primary Examiner* — Aniss Chad
(74) *Attorney, Agent, or Firm* — Kilpatrick Townsend & Stockton LLP

(57) ABSTRACT

Systems and methods for facilitating a home energy audit. In one embodiment, a plurality of user inputs can be received that pertain to an energy audit of a home, where the plurality of user inputs user inputs can include one or more two-dimensional layouts of the home. The user inputs can be converted into input data appropriate for consumption by an energy simulation engine, where the converting can comprise generating a three-dimensional model of the home can be generated based on the one or more two-dimensional layouts. A yearly energy simulation of the home can then be executed via the energy simulation engine based on the input data.

24 Claims, 34 Drawing Sheets

(56) References Cited

OTHER PUBLICATIONS

"Treat Software" Web page http://www.psdconsulting.com/software/treat, 3 pages, Feb. 2, 2012, retrieved from Internet Archive Wayback Machine < http://web.archive.org/web/20120202052038/http://www.www.psdconsulting.com/software/treat on Dec. 16, 2014.

"EnergyPro" Web page http://www.energysoft.com/main/page_energypro_ep_information.html, 2 pages, Feb. 25, 2012, retrieved from Internet Archive Wayback Machine < http://web.archive.org/web/20120225075733/http://www.energysoft.com/main/page_energypro_ep_information.html on Dec. 16, 2014.

"REM/Rate" Web page http://www.archenergy.com/products/remrate, 2 pages, Feb. 15, 2012, retrieved from Internet Archive Wayback Machine < http://web.archive.org/web/20120215173710/http://www.archenergy.com/products/remrate on Dec. 16, 2014.

"Home Energy Saver" Web page http://hes.lbl.gov.consumer, 1 page, Feb. 3, 2012, retrieved from Internet Archive Wayback Machine < http://web.archive.org/web/20120203154206/http://hes.lbl.gov.consumer on Dec. 16, 2014.

"Wrightsoft (Right-Suite) Software" Web page http://www.wrightsoft.com/, 2 pages, Feb. 6, 2012, retrieved from Internet Archive Wayback Machine < http://web.archive.org/web/20120206062216/http://www.wrightsoft.com/ on Dec. 16, 2014.

"EnergyMeasure" Web page http://www.energymeasure.com/, 2 pages, Jan. 24, 2012, retrieved from Internet Archive Wayback Machine < http://web.archive.org/web/20120124150429/http://www.energymeasure.com/ on Dec. 16, 2014.

"Elite Software" Web page http://www.elitesoft.com/web/hvacr/elite_auditw_info.html, 6 pages, Apr. 19, 2012, retrieved from Internet Archive Wayback Machine < http://web.archive.org/web/20120419031414/http://www.elitesoft.com/web/hvacr/elite_auditw_info.html on Dec. 16, 2014.

"Home Energy Tune Up Software" Web page http://www.homeenergytuneup.com/software.html, 1 page, May 18, 2013, retrieved from Internet Archive Wayback Machine < http://web.archive.org/web/20130518063642/http://www.homeenergytuneup.com/ on Dec. 16, 2014.

"Recurve Software" Web page http://www.recurve.com/, 2 pages, Feb. 9, 2012, retrieved from Internet Archive Wayback Machine < http://web.archive.org/web/20120209005417/http://www.recurve.com/ on Dec. 15, 2014.

* cited by examiner

Site audit Status

Forms

Preliminary interview
- Step 1: Customer survey - complete
- Step 2: Construction survey - complete Load calculations
- Step 1: Construction details - complete
- Step 2: Construction defaults - complete
- Step 3: Site survey - complete
- Step 4: Room survey - incomplete
  - Room 1:other / dishwasher: make can't be blank, Room 1:other / clothes dryer: year is not a number, Room 1:other / dishwasher: model can't be blank, Room 1:other / clothes dryer: make can't be blank, Room 1:other / register 1: length is not a number, Room 1:other / dishwasher: year is not a number, Room 1:other / register 1: width is not a number, and Room 1:other / clothes dryer: model can't be blank
- Step 5: Infiltration - complete
- Step 6: Duct system - complete Home performance
- Step 1: Hvac equipment - complete
- Step 2: Water heater survey - complete
- Step 3: Pool - complete
- Step 4: Combustion analysis - incomplete
  - Combustion zone 1: gas venting condition can't be blank and Combustion zone 1: gas venting condition is not included in the list Usage
- Step 1: Thermostat settings - complete
- Step 2: Hot water demand - complete
- Step 3: Appliance usage - complete
- Step 4: Plug loads - complete
- Step 5: Lighting schedule - complete Energy bills
- Step 1: Energy bills - complete Final checklist
- Step 1: Photo upload - complete
- Step 2: Final checklist - complete

SYSTEMS AND METHODS FOR HOME ENERGY AUDITING

BACKGROUND

The present disclosure relates in general to home performance contracting, and in particular to techniques for facilitating a home energy audit.

Within the last twenty years, diagnostic techniques have been developed to systematically analyze and model the performance of residential buildings with respect to energy consumption and efficiency. The implementation of these techniques, along with building science principles, has led to the formation of the field of home performance contracting. Home performance contracting takes a scientific, whole house approach to evaluating the energy performance of residential buildings, taking into account multiple or systemic causes to problems that, until recently, have been dealt with in patchwork ways with inexact sciences guiding the process.

Home performance contractors typically begin a home evaluation by conducting a home survey and a series of diagnostic tests that collect data regarding how the home uses, or loses, energy. Examples of such tests includes a blower door test to measure air leakage in the building envelope, a duct blaster test to measure air leakage in the forced-air distribution system, a furnace combustion test to check the safety and efficiency of an installed gas furnace, and others. The data collected from the survey and tests is then analyzed to identify ways in which the home's energy efficiency can be improved, as well as estimate potential energy savings from implementing such improvements. Once the data is analyzed, a remediation plan is created that provides a summary of the analyzed data, the proposed improvements, and the estimated energy savings to the homeowner. This entire process, from survey/testing to remediation plan creation, is known as a home energy audit.

In the past, home performance contractors have managed the home energy audit process manually, or with computer programs that suffered from various limitations such as poor usability and relatively simple data analysis features. Accordingly, it would be desirable to have an improved computer-implemented tool that allows contractors to easily enter and comprehensively analyze the data that is collected during a home energy audit, thereby enabling the generation of detailed, accurate, and useful results for the homeowner.

SUMMARY

Embodiments of the present invention relate to systems and methods for facilitating a home energy audit. According to one embodiment, a method is provided that can comprise receiving from a user a plurality of user inputs that pertain to an energy audit of a home, where the plurality of user inputs can include one or more two-dimensional layouts of the home. The method can further comprise converting the plurality of inputs into input data appropriate for consumption by an energy simulation engine, where the converting can comprise generating a three-dimensional model of the home based on the one or more two-dimensional layouts. A yearly energy simulation of the home can then be executed via the energy simulation engine based on the input data.

In one embodiment, the plurality of user inputs can further include construction surface descriptions for a plurality of construction elements, where the plurality of construction elements can include windows, doors, walls, ceilings, floors, and skylights.

In one embodiment, the one or more two-dimensional layouts can be specified using the construction surface descriptions.

In one embodiment, generating the three-dimensional model can comprise assigning a construction surface description to each surface of the three-dimensional model based on the one or more two-dimensional layouts.

In one embodiment, the converting can further comprise, for each construction surface description assigned to a surface of the three-dimensional model, transforming user inputs pertaining to the construction surface description into physical properties based on the ASHRAE Handbook of Fundamentals.

In one embodiment, the plurality of user inputs can further include, for each room in the house, lighting information, plug load information, and appliance information.

In one embodiment, the appliance information can include a make and model of a household appliance, and an appliance database can be accessed to determine technical specifications for the household appliance.

In one embodiment, the converting can further comprise generating electrical models for the home based on the lighting information, the plug load information, and the appliance information.

In one embodiment, the plurality of user inputs can further include air infiltration results collected via a blower door test and duct leakage data collected via a duct blaster test.

In one embodiment, the converting can further comprise converting the air infiltration results into leakage areas for calculation with stack coefficients and wind coefficients.

In one embodiment, the plurality of user inputs can further include information regarding mechanical equipment installed in the home, the mechanical equipment including heating equipment, cooling equipment, water heaters, and pool pumps.

In one embodiment, the converting can further comprise generating a data object for each piece of mechanical equipment based on specifications retrieved from an equipment specifications database.

In one embodiment, the plurality of user inputs can further include historical energy bill data for an owner of the home.

In one embodiment, the converting can further comprise generating operational schedules for appliances and mechanical equipment in the home.

In one embodiment, the operational schedules can be based, at least in part, on the historical energy bill data.

In one embodiment, executing the yearly energy simulation of the home can comprise executing multiple simulations in parallel, the multiple simulations including a base scenario and a plurality of remediation scenarios, where each remediation scenario can correspond to a different modification of the base scenario for improving energy efficiency of the home in a specific area.

In one embodiment, the method can further comprise receiving output data from the energy simulation engine in response to the execution of the yearly energy simulation, and converting the output data into customer facing data.

In one embodiment, converting the output data into customer facing data can comprise determining, for every hour of a simulated year, total energy expenditure values, in terms of electricity and fuel, for each of the following components: heating equipment, cooling equipment, heating blower, cooling blower, water heater, lights, appliances, plug loads, pool pumps, and water pipes.

In one embodiment, the total energy expenditure values can be scaled against the historical energy bill data for the owner of the home.

In one embodiment, converting the output data into customer facing data can comprise determining, for every hour of a simulated year, Time Dependent Value (TDV) source values for electricity and fuel.

In one embodiment, converting the output data into customer facing data can comprise determining demand values representing maximum power expenditure for the home per month.

In one embodiment, converting the output data into customer facing data can comprise calculating duct system losses.

In one embodiment, converting the output data into customer facing data can comprise, for each remediation scenario, calculating prices and return on investment (ROI) of products associated with the remediation scenario.

According to another embodiment of the present invention, a non-transitory computer readable medium is provided that has stored thereon program code executable by a computer system. The program code can comprise code that causes the computer system to receive from a user a plurality of user inputs that pertain to an energy audit of a home, the plurality of user inputs including one or more two-dimensional layouts of the home; code that causes the computer system to convert the plurality of inputs into input data appropriate from consumption by an energy simulation engine, the converting comprising generating a three-dimensional model of the home based on the one or more two-dimensional layouts; and code that causes the computer system to execute, via the energy simulation engine, a yearly energy simulation of the home based on the input data.

According to another embodiment of the present invention, a system is provided that comprises a processor. The processor can be configured to receive from a user a plurality of user inputs that pertain to an energy audit of a home, the plurality of user inputs including one or more two-dimensional layouts of the home; convert the plurality of inputs into input data appropriate from consumption by an energy simulation engine, the converting comprising generating a three-dimensional model of the home based on the one or more two-dimensional layouts; and execute, via the energy simulation engine, a yearly energy simulation of the home based on the input data.

A further understanding of the nature and advantages of the embodiments disclosed herein can be realized by reference to the remaining portions of the specification and the attached drawings.

BRIEF DESCRIPTION OF THE DRAWINGS

FIG. 4 is an example of a graphical user interface for displaying the status of a home energy audit according to an embodiment of the present invention.

FIG. 5 is an example of a graphical user interface for entering customer survey information according to an embodiment of the present invention.

FIG. 6 is an example of a graphical user interface for entering construction survey information according to an embodiment of the present invention.

FIG. 7 is an example of a graphical user interface for entering construction details according to an embodiment of the present invention.

FIG. 8 is an example of a graphical user interface for entering construction defaults according to an embodiment of the present invention.

Figures 18A, 18B:
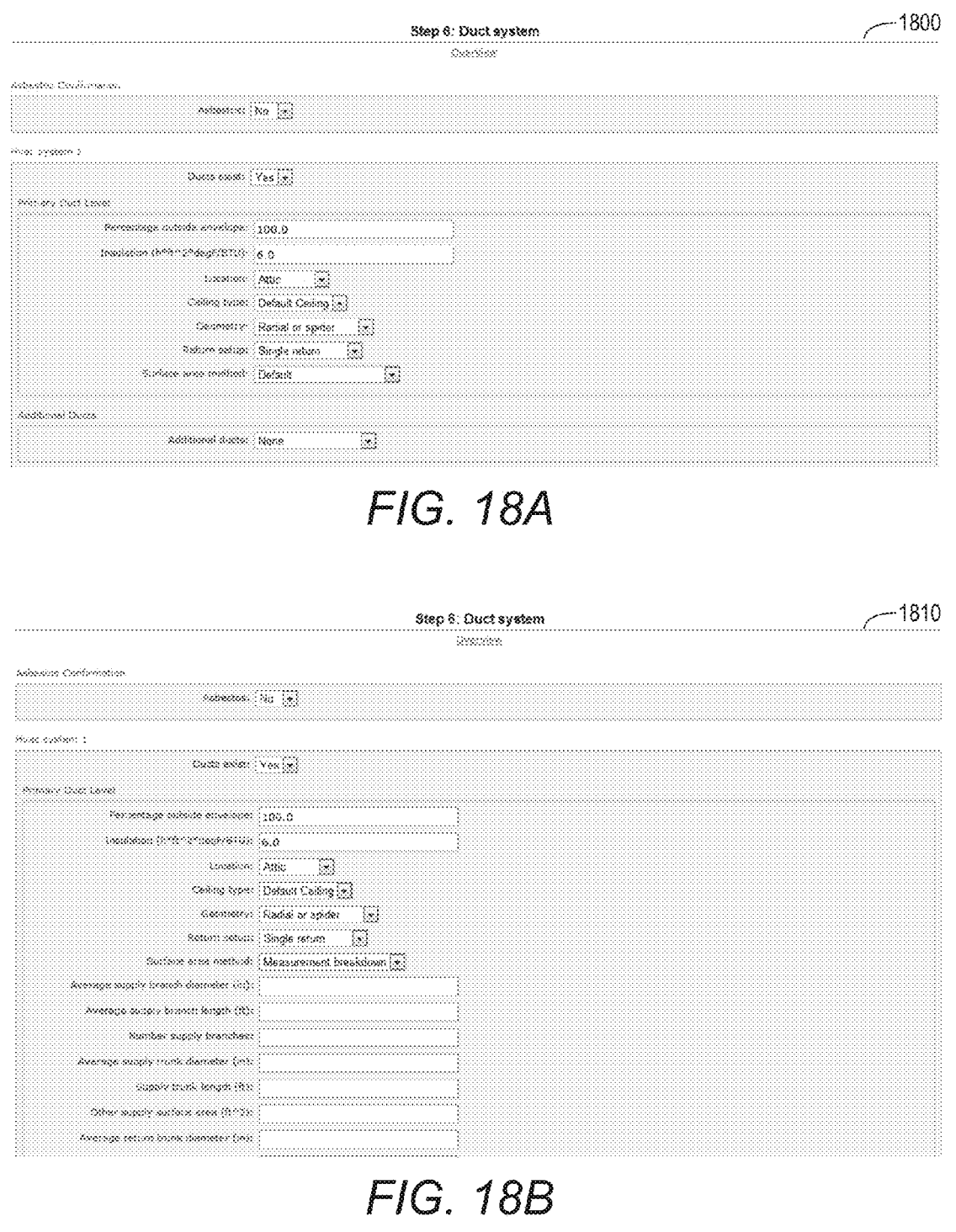
Figure 18C:
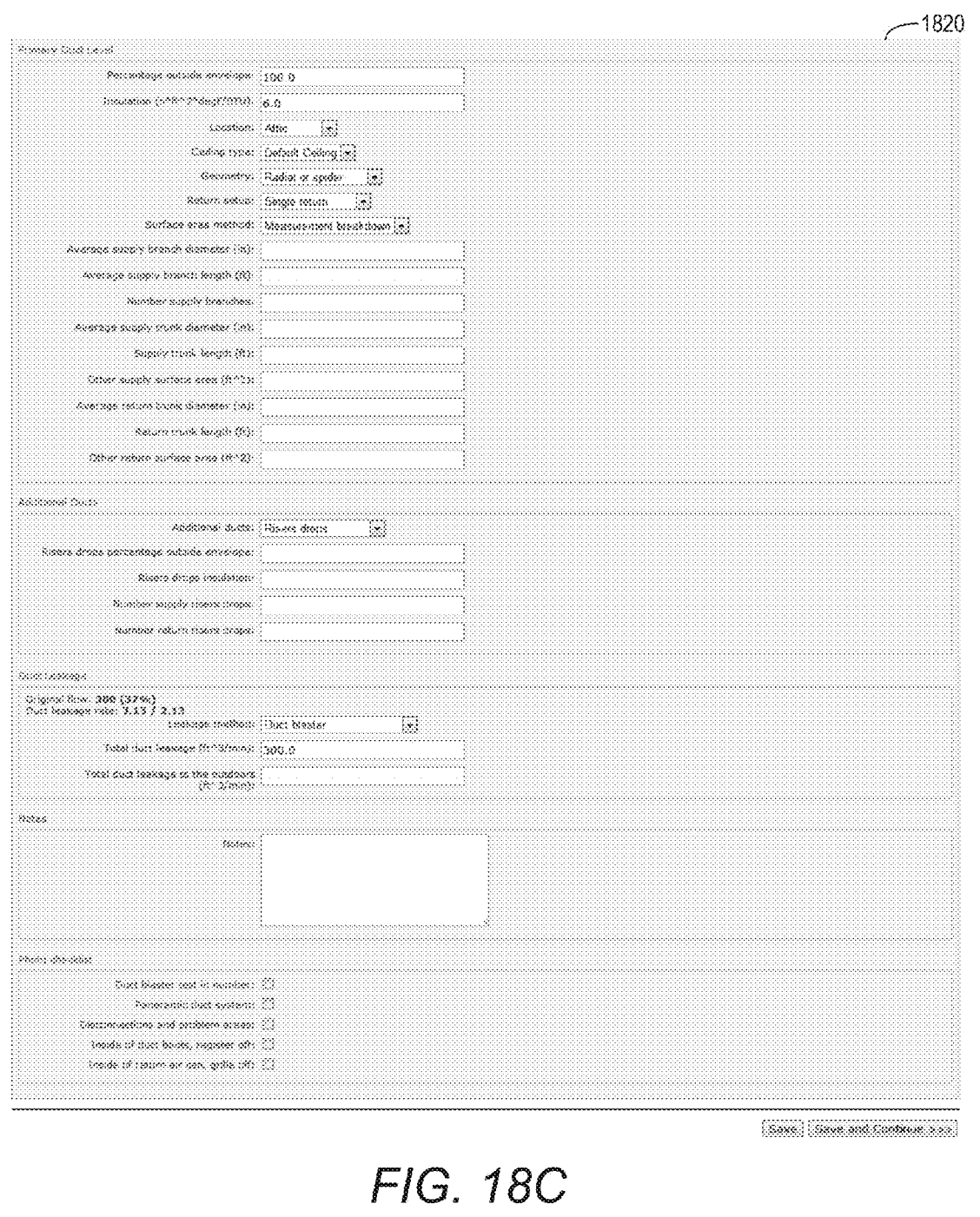

FIGS. 18A, 18B, and 18C are examples of graphical user interfaces for entering duct system information according to an embodiment of the present invention.

FIGS. 19A and 19B are examples of graphical user interfaces for entering HVAC equipment information according to an embodiment of the present invention.

FIG. 20 is an example of a graphical user interface for entering water heater information according to an embodiment of the present invention.

FIG. 21 is an example of a graphical user interface for entering pool information according to an embodiment of the present invention.

Figures 24, 25:
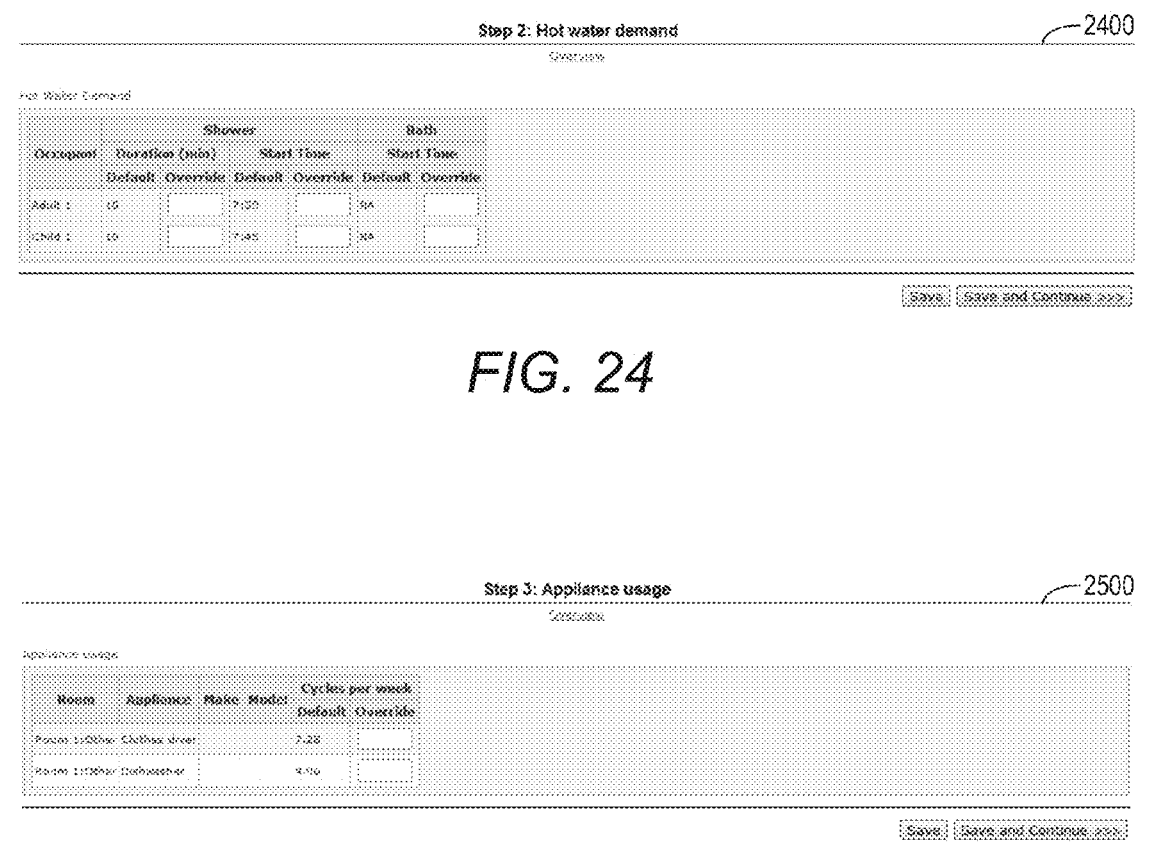

FIG. 24 is an example of a graphical user interface for entering hot water demand according to an embodiment of the present invention.

FIG. 25 is an example of a graphical user interface for entering appliance usage information according to an embodiment of the present invention.

Figures 26, 27:
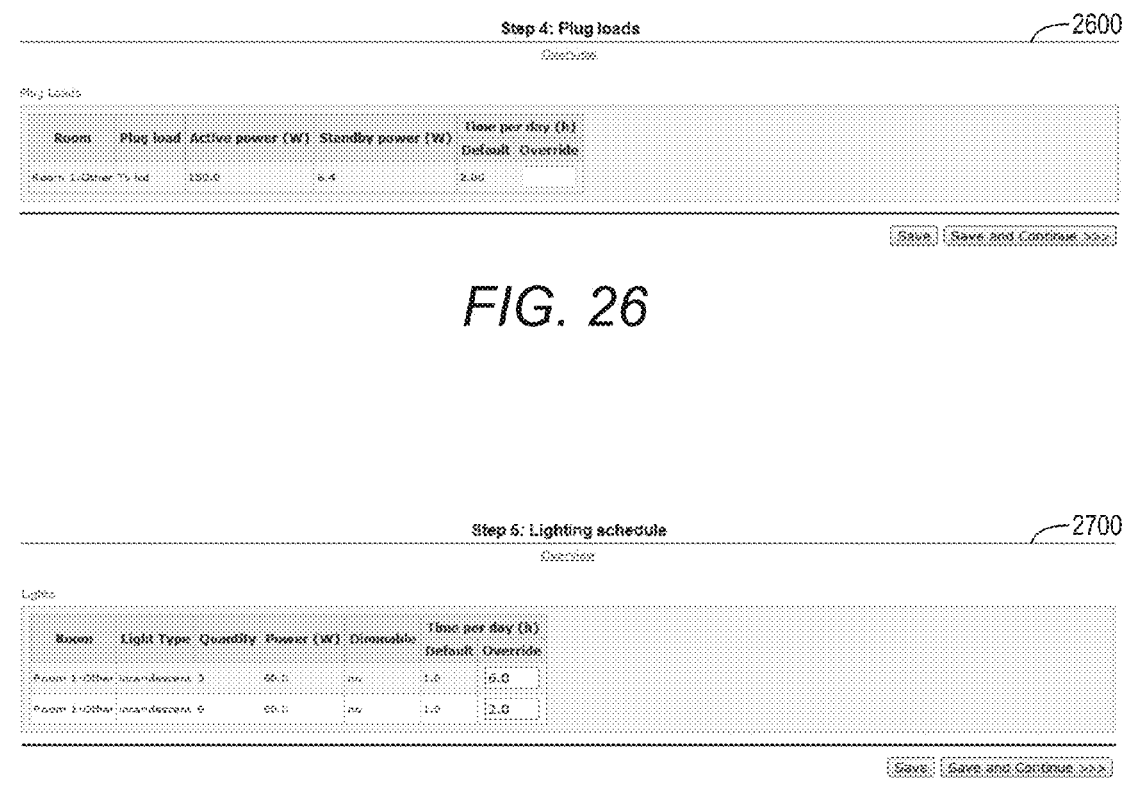

FIG. 26 is an example of a graphical user interface for entering plug loads according to an embodiment of the present invention.

FIG. 27 is an example of a graphical user interface for entering lighting schedule information according to an embodiment of the present invention.

FIG. 29 is an example of a graphical user interface for uploading home photos according to an embodiment of the present invention.

FIG. 30 is an example of a graphical user interface for presenting a final checklist according to an embodiment of the present invention.

DETAILED DESCRIPTION

Figure 1:
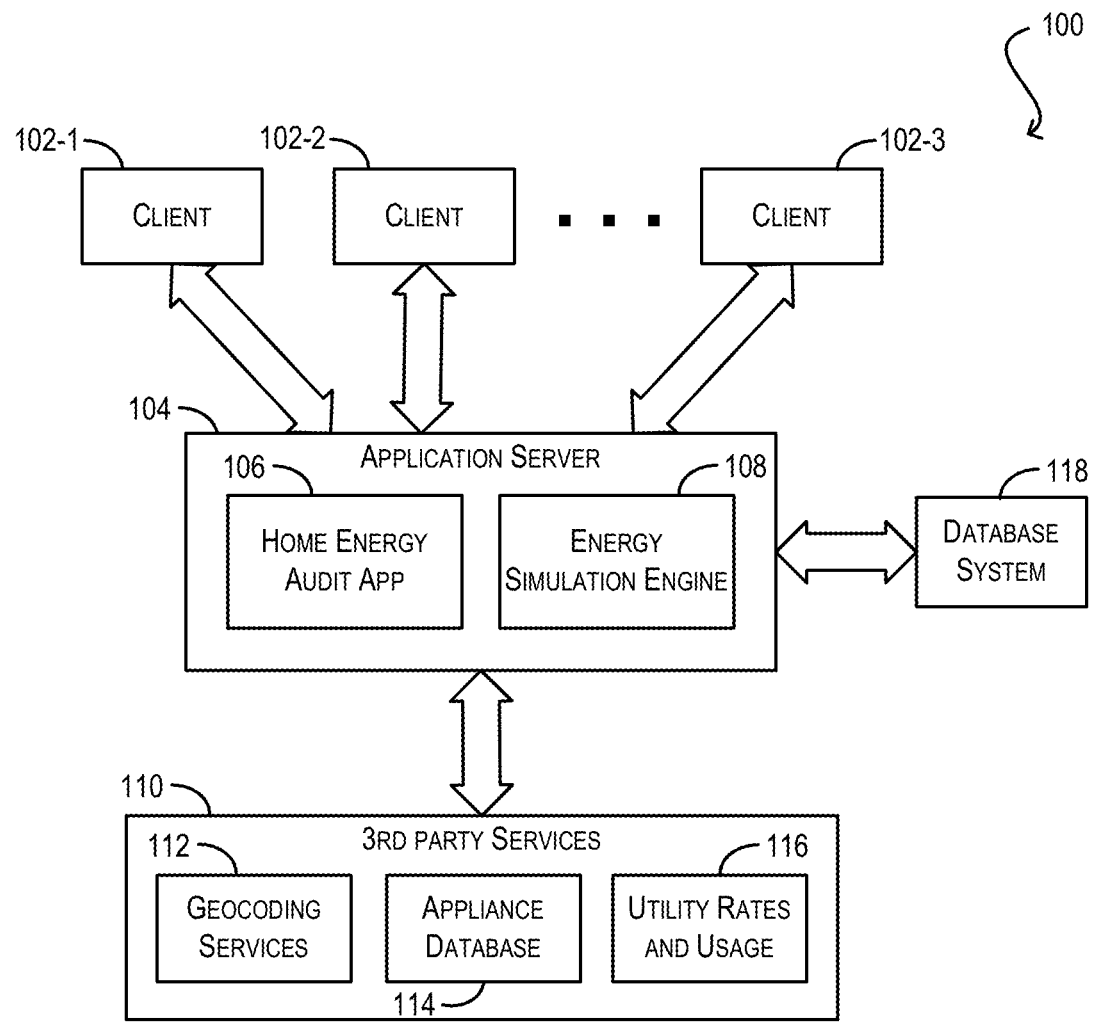
FIG. 1 is a simplified block diagram of a system environment according to an embodiment of the present invention.

In the following description, for purposes of explanation, numerous examples and details are set forth in order to provide an understanding of embodiments of the present invention. It will be evident, however, to one skilled in the art that certain embodiments can be practiced without some of these details, or can be practiced with modifications or equivalents thereof.

Embodiments of the present invention provide a computer-implemented tool for facilitating the home energy audit process. In one embodiment, the tool can be implemented as a distributed software application hosted on, e.g., a web or application server. In another embodiment, the tool can be implemented as a standalone (e.g., desktop) software application configured to run autonomously on one or more computing devices. In operation, the tool can receive various user inputs pertaining to an energy audit of a home. These user inputs can include, e.g., one or more two-dimensional layouts of the home, construction surface descriptions for construction elements in the home, and more. The tool can then convert the user inputs into input data appropriate for consumption by a dedicated energy simulation engine, such as the Department of Energy's EnergyPlus program. For instance, as part of this conversion process, the tool can generate a three-dimensional model of the home based on the user-provided two-dimensional layouts. Once the user inputs have been converted, the tool can invoke the energy simulation engine with the input data to execute a yearly energy simulation of the home.

With the tool described above, dedicated energy simulation engines such as EnergyPlus can be leveraged to provide comprehensive data analysis and simulation for a residential energy audit, without requiring substantial training or time on the part of the contractors tasked with carrying out the audit (i.e., the auditors). For example, in certain embodiments, the tool can guide an auditor through an organized series of user interface screens in which he/she need only enter information that is easily ascertainable via visual inspection of a home or via the performance of standard diagnostic tests. This information can then be automatically converted into detailed specifications (e.g., three-dimensional coordinates for surfaces, physical surface properties, electrical models, etc.) that are needed by the simulation engine in order to carry out a yearly energy simulation.

Further, in certain embodiments, the tool can run multiple energy simulations for a single home in parallel, where the multiple simulations can include a base scenario (based on the auditor's inputs) and one or more remediation scenarios. The remediation scenarios can correspond to modifications to the base scenario for simulating the effect of specific improvements on the energy efficiency of the home. For example, a simulation can be run with the assumption that a new, high-efficiency gas furnace has been installed, or that additional insulation has been added to the attic. In this manner, a wide range of potential home improvements can be quickly modeled to determine the exact energy savings for each improvement.

Yet further, in certain embodiments, the tool can automatically convert output generated by the energy simulation engine into customer facing data that is readily understandable by, and useful to, a customer of the audit (e.g., the homeowner, utility company, etc.). Examples of such customer facing data can include energy expenditure values that are broken down by components (e.g., heating equipment, cooling equipment, etc.) and/or living areas, costs and return on investment (ROI) for various remediation measures, and more. With this feature, the auditor does not need to manually parse and interpret the simulation engine output to calculate metrics and data points that will be of interest to the customer; instead, this process can be completely automated. In addition, the customer can be provided with detailed and accurate information that empowers the customer to make informed decisions regarding potential home improvements.

FIG. 1 is a simplified block diagram of a system environment 100 according to an embodiment of the present invention. As shown, system environment 100 includes a number of client devices (102-1, 102-2, 102-3) that are communicatively coupled with an application server 104. Client devices 102-1, 102-2, 102-3 and application server 104 can be coupled via any type of computer network known in the art, such as a local area network (LAN), a wide-area network (WAN), or the Internet. Although FIG. 1 depicts three clients and one application server, any number of these entities can be supported.

Client devices 102-1, 102-2, and 102-3 are end-user computing devices, such as a desktop computer, a laptop computer, a personal digital assistant, a smartphone, a tablet, or the like. In one embodiment, client devices 102-1, 102-2, and 102-3 can each execute (via, e.g., a standard web browser or proprietary software) a client component of a distributed software application hosted on application server 104, thereby enabling users of devices 102-1, 102-2, and 102-3 to interact with the application. In the case of a web application, executing this client component can include rendering, in a client web browser, HyperText Markup Language (HTML) content that is received from application server 104, receiving user input via one or more HTML input controls, and transmitting the user input via an HTTP request to application server 104. Execution of the client component can also include running program code, such as JavaScript or a Java applet, that may be received from server 104.

Application server 104 is a computer system (or a cluster/farm of computer systems) that is configured to provide an environment in which the server component of a distributed software application can be executed. For example, application server 104 can receive a request from client 102-1, 102-2, or 102-3 that is directed to an application hosted on server 104, process the request using business logic defined for the application, and then generate information responsive to the request for transmission to the client. In embodiments where application server 104 is configured to host one or more web applications, server 104 can incorporate a web server module (e.g., Apache, Oracle HTTP Server, etc.) to handle the web-specific tasks of receiving Hypertext Transfer Protocol (HTTP) requests from clients 102-1, 102-2, and 102-3 and servicing those requests by returning HTTP responses.

In the example of FIG. 1, application server 104 is configured to host particular type of application referred to as a home energy audit application (106). Home energy audit application 106 can be implemented as either a web application or a proprietary client-server application, and can provide various functions for facilitating the execution of a residential energy audit. For instance, home energy audit application 106 can present, to one or more users operating client devices 102-1, 102-2, and 102-3 (e.g., auditors), a series of user interface screens for entering information pertaining to an energy audit of a home. Upon receiving the user inputs from client devices 102-1, 102-2, and 102-3, home energy audit application 106 can convert the user inputs into input data that is appropriate for consumption by a dedicated energy simulation engine 108 (e.g., the Department of Energy's EnergyPlus program), and invoke engine 108 using the input data to run one or more yearly energy simulations of the home. Home energy audit application 106 can then convert the data output by energy simulation engine 108 as a result of performing the simulations into customer facing data for presentation to a customer of the audit (e.g., the homeowner, a utility company, etc.).

As part of its processing, home energy audit application 106 can interact with one or more third-party services 110 (e.g., geocoding services 112, appliance database 114, and utility rates and usage 116) to retrieve data that may be useful in carrying out the simulations. In addition, home energy audit application 106 can interact with a database system 118 to store and retrieve information pertaining to the audit. In one embodiment, database system 118 can be implemented using a relational database program (e.g., Oracle 11g, SQLite, MySQL, etc.) that is adapted to store, update, and retrieve data in response to SQL-formatted commands. Although database system 118 is depicted as being separate from application server 104, one of ordinary skill in the art will appreciate that server 104 and database system 118 can be combined into a single physical machine.

It should be appreciated that system environment 100 is illustrative and is not intended to limit embodiments of the present invention. For example, the various entities depicted in system environment 100 can have other capabilities or include other components that are not specifically described. One of ordinary skill in the art will recognize many variations, modifications, and alternatives.

Figure 2:
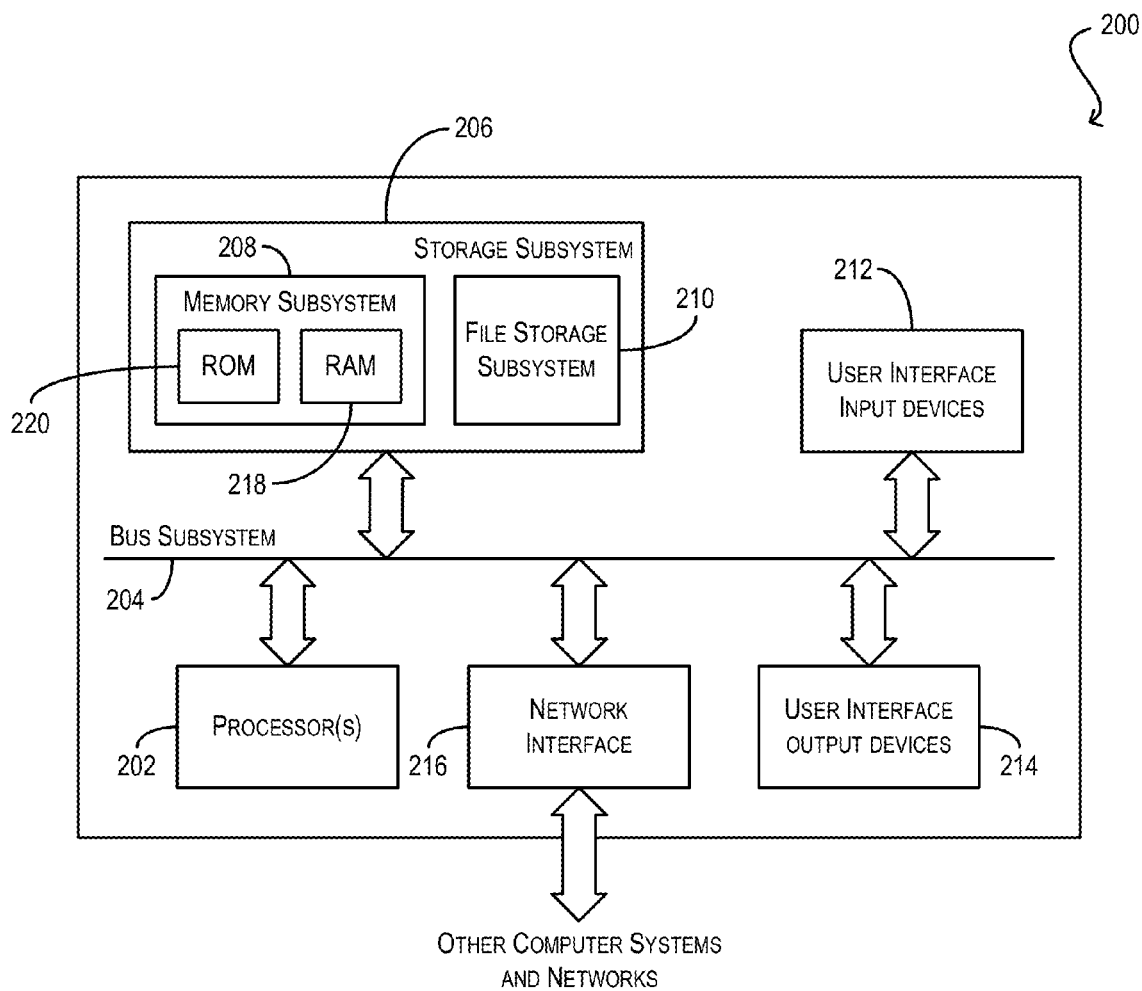
FIG. 2 is a simplified block diagram of a computer system according to an embodiment of the present invention.

FIG. 2 is a simplified block diagram of a computer system 200 according to an embodiment of the present invention. In one embodiment, computer system 200 can be used to implement any of the computing devices/systems described with respect to FIG. 1. As shown in FIG. 2, computer system 200 includes one or more processors 202 that communicate with a number of peripheral devices via a bus subsystem 204. These peripheral devices include a storage subsystem 206 (comprising a memory subsystem 208 and a file storage subsystem 210), user interface input devices 212, user interface output devices 214, and a network interface subsystem 216.

Bus subsystem 204 can provide a mechanism for letting the various components and subsystems of computer system 200 communicate with each other as intended. Although bus subsystem 204 is shown schematically as a single bus, alternative embodiments of the bus subsystem can utilize multiple busses.

Network interface subsystem 216 can serve as an interface for communicating data between computer system 200 and other computer systems or networks. Embodiments of network interface subsystem 216 can include, e.g., an Ethernet card, a Wi-Fi and/or cellular adapter, a modem (telephone, satellite, cable, ISDN, etc.), digital subscriber line (DSL) units, and/or the like.

User interface input devices 212 can include a keyboard, pointing devices (e.g., mouse, trackball, touchpad, etc.), a scanner, a barcode scanner, a touch-screen incorporated into a display, audio input devices (e.g., voice recognition systems, microphones, etc.) and other types of input devices. In general, use of the term "input device" is intended to include all possible types of devices and mechanisms for inputting information into computer system 200.

User interface output devices 214 can include a display subsystem, a printer, a fax machine, or non-visual displays such as audio output devices, etc. The display subsystem can be a cathode ray tube (CRT), a flat-panel device such as a liquid crystal display (LCD), or a projection device. In general, use of the term "output device" is intended to include all possible types of devices and mechanisms for outputting information from computer system 200.

Storage subsystem 206 includes a memory subsystem 208 and a file/disk storage subsystem 210. Subsystems 208 and 210 represent non-transitory computer-readable storage media that can store program code and/or data that provide the functionality of embodiments of the present invention.

Memory subsystem 208 include a number of memories including a main random access memory (RAM) 218 for storage of instructions and data during program execution and a read-only memory (ROM) 220 in which fixed instructions are stored. File storage subsystem 210 can provide persistent (i.e., non-volatile) storage for program and data files, and can include a magnetic or solid-state hard disk drive, an optical drive along with associated removable media (e.g., CD-ROM, DVD, Blu-Ray, etc.), a removable flash memory-based drive or card, and/or other types of storage media known in the art.

It should be appreciated that computer system 200 is illustrative and not intended to limit embodiments of the present invention. Many other configurations having more or fewer components than system 200 are possible.

Figure 3:
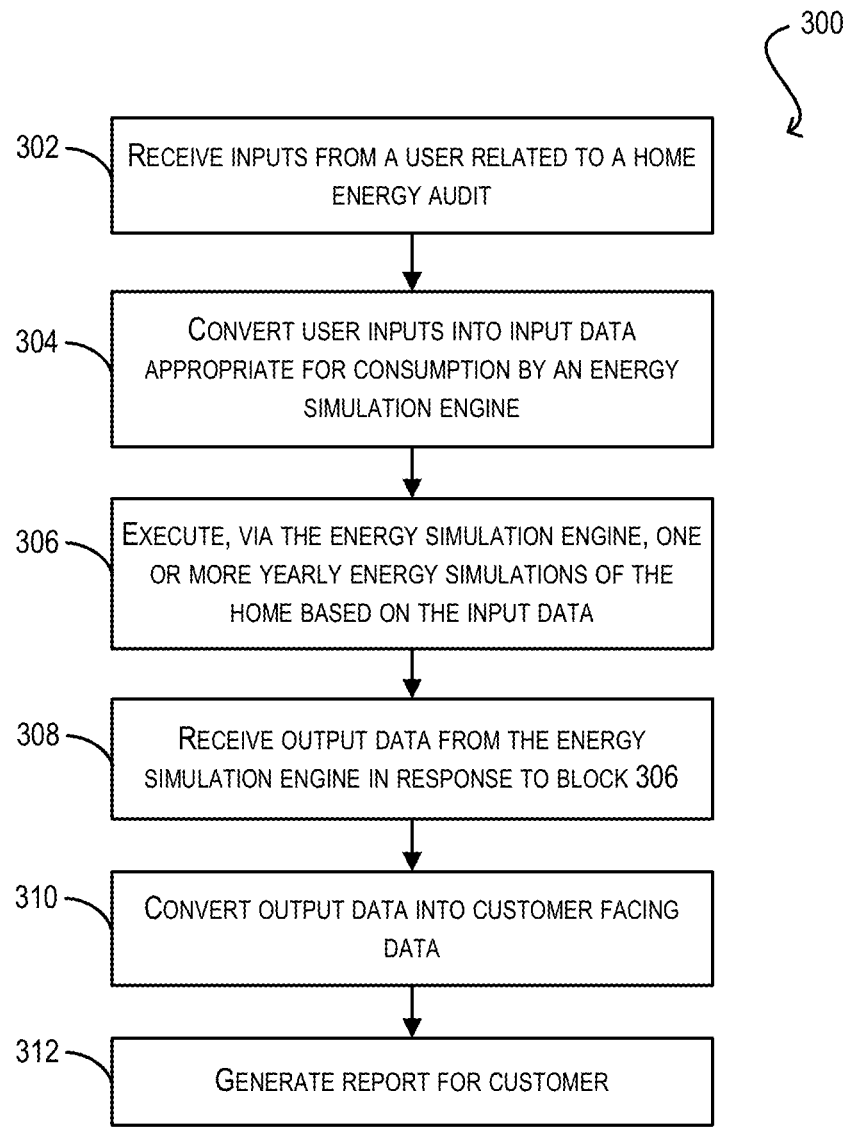
FIG. 3 is a flow diagram illustrating a process for facilitating a home energy audit according to an embodiment of the present invention.
Figure 9:
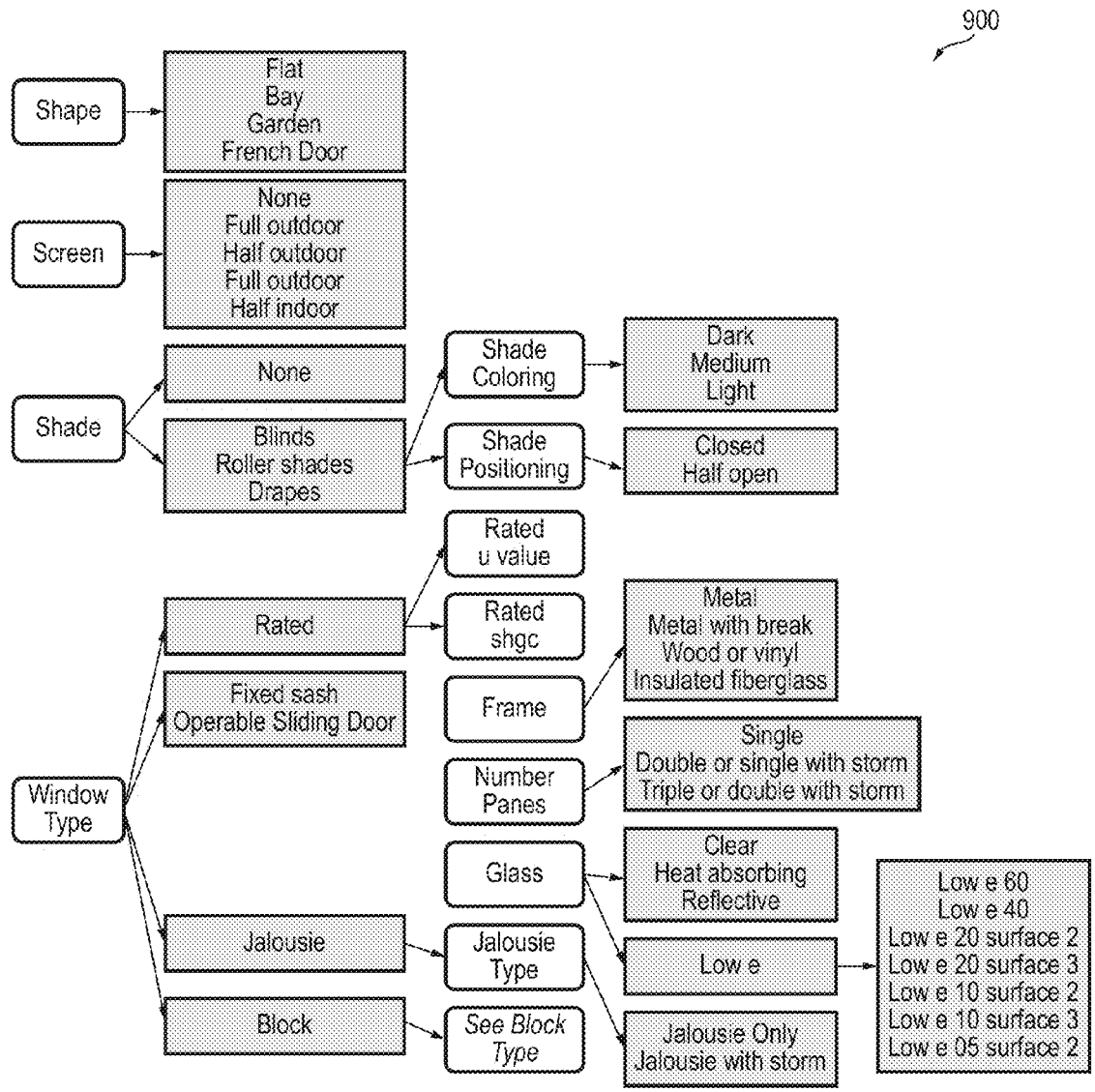
FIGS. 9-14 are examples of user interface flows for specifying construction surface descriptions according to an embodiment of the present invention.
Figure 10:
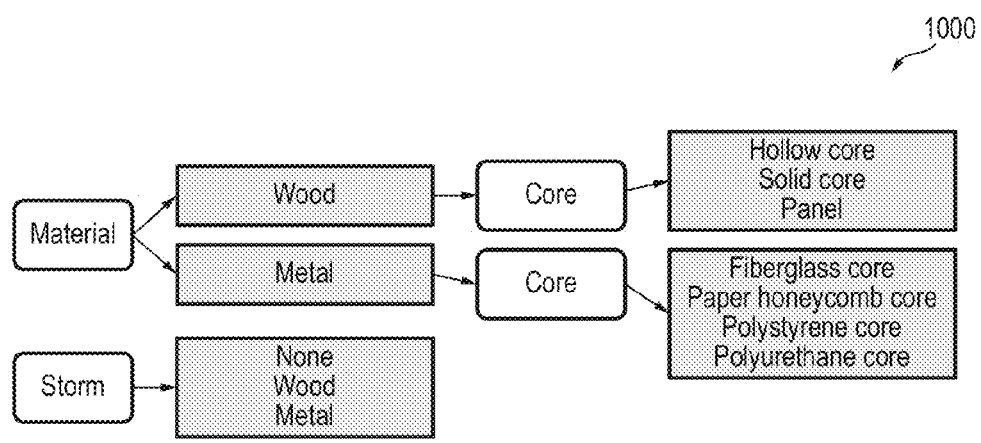
Figure 11:
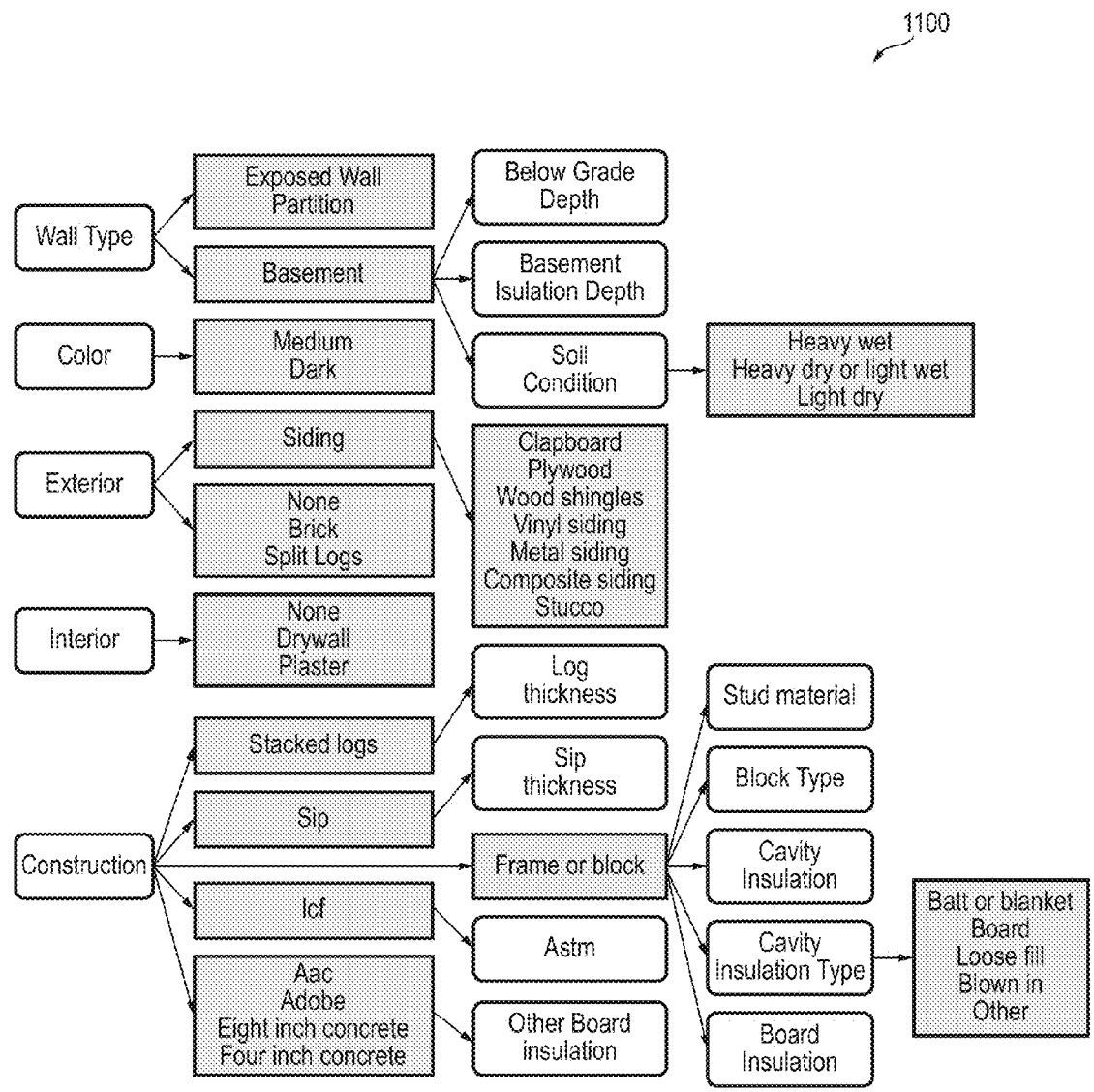
Figure 12:
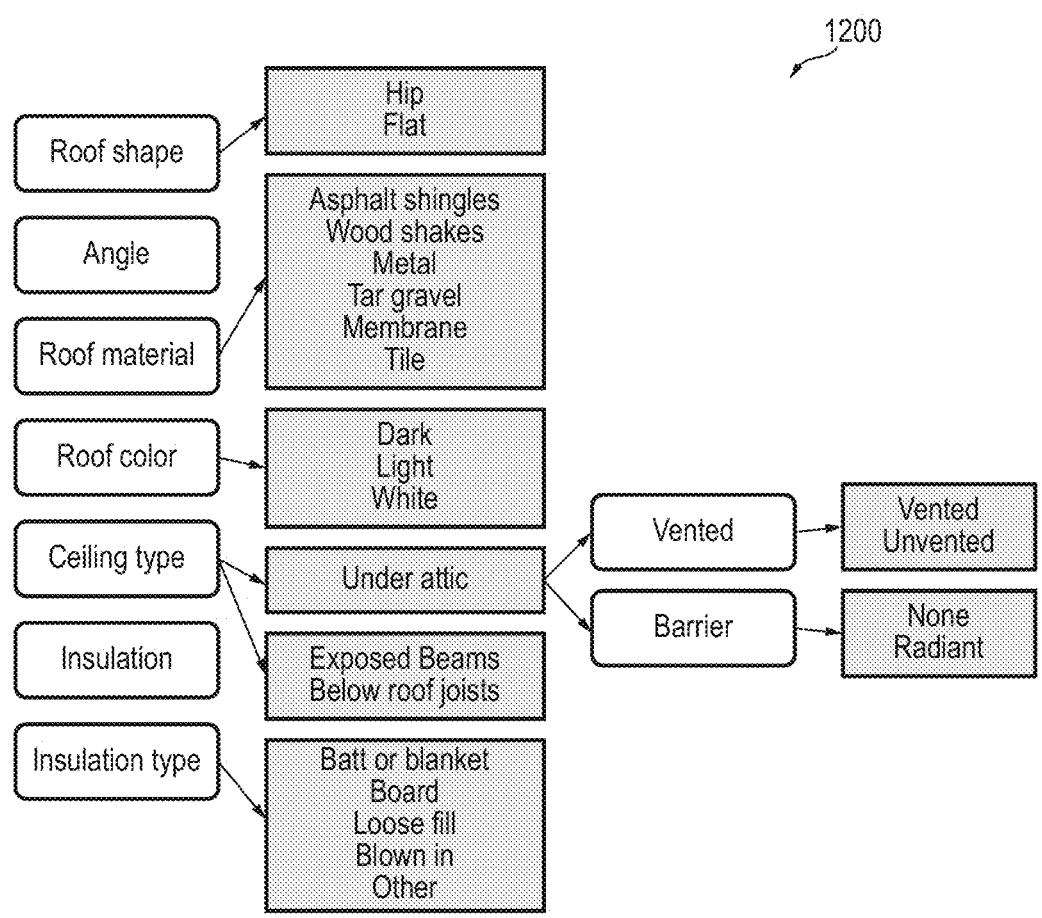
Figure 13:
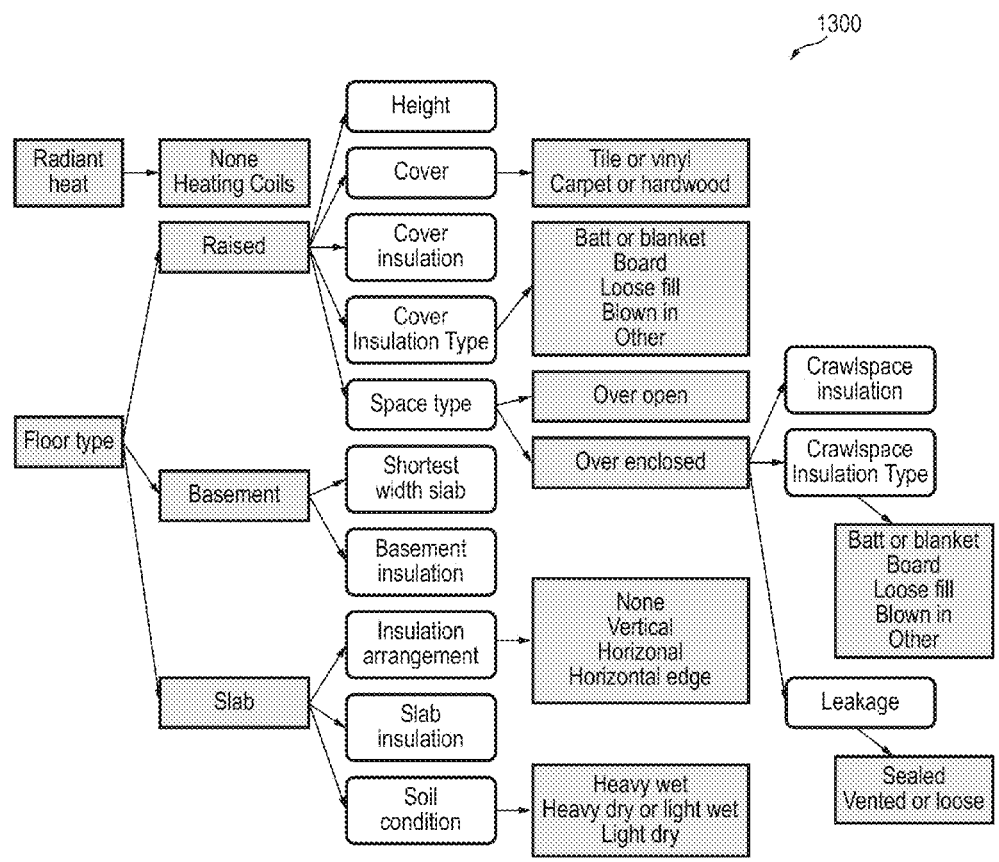
Figure 14:
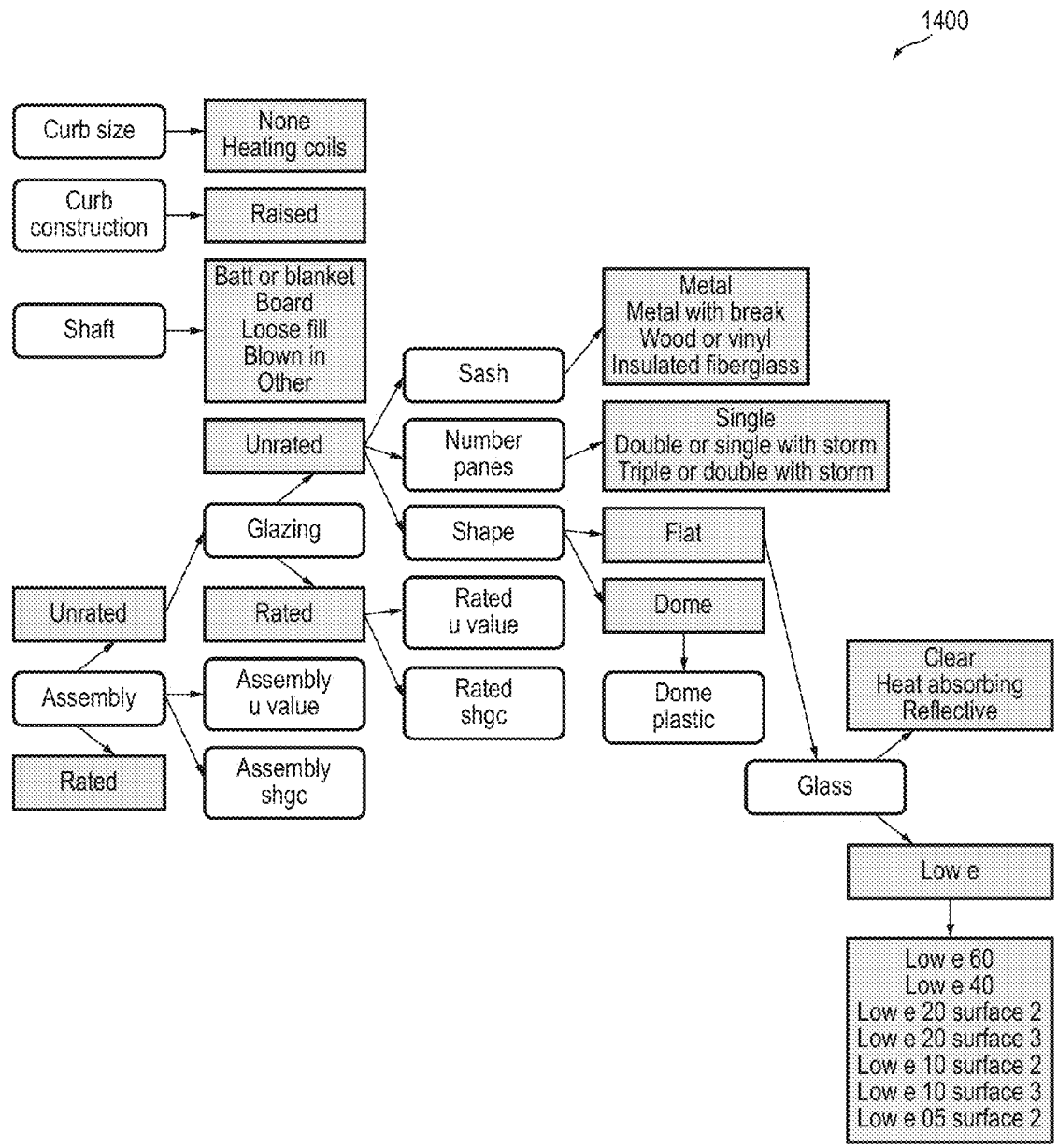

FIG. 3 illustrates a process 300 that can be carried out by home energy audit application 106 of FIG. 1 for facilitating home energy auditing according to an embodiment of the present invention. At block 302, home energy audit application 106 can receive inputs from a user (e.g., an auditor operating client 102-1, 102-2, or 102-3) related to an energy audit of a home. Such inputs can include, e.g., two-dimensional layouts of the home, construction surface descriptions of construction elements in the home, appliance information, mechanical equipment information, and more. In one embodiment, these inputs can be entered via an ordered series of user interface screens that are generated by home energy audit application 106 and presented to the user.

At block 304, home energy audit application 106 can convert the user inputs into input data that is appropriate for consumption by a dedicated energy simulation engine (e.g., engine 108 of FIG. 1). This conversion can include, e.g., generating a three-dimensional model of the home based on user-provided two-dimensional layouts, determining physical properties of construction elements based on user-provided construction surface descriptions, generating electrical models, and so on. Thus with the processing of block 304, the user need not have particular knowledge on how energy simulation engine 108 works or what types of input data the engine specifically requires. Rather, the user need only provide information that he/she would typically collect as a result of surveying and testing the home. This information is then automatically translated into detailed specifications that are needed by the simulation engine in order to carry out a simulation run.

At block 306, home energy audit application 106 can execute, via engine 108, one or more yearly energy simulations of the home based on the input data generated at block 304. In a particular embodiment, application 106 can execute multiple simulations for the home in parallel, where the multiple simulations can include a base scenario (based on the original input data) and one or more remediation scenarios (based on modifications to the original input data). The remediation scenarios can be used to simulate the effect of specific improvements on the energy efficiency of the home. For example, the remediation scenarios can include a scenario in which wall/ceiling/floor insulation is increased, a scenario in which appliances are replaced with high-efficiency models, a scenario in which the duct system is sealed, and more. In this manner, a wide range of potential home improvements can be quickly modeled to determine the exact energy savings for each improvement.

At block 308, home energy audit application 106 can receive output data from energy simulation engine 108 in response to the simulation runs performed at block 306. Application 106 can then convert the output data into customer facing data that is useful and relevant to the customer of the audit (e.g., the homeowner, a utility company, etc.) (block 310). In one embodiment, this can include scaling simulated energy expenditure values by information about the homeowner's past energy usage (e.g., the homeowner's historical energy bills). In another embodiment, this can include estimating certain values, such as duct system energy losses, which may not be simulated by energy simulation engine 108. In yet another embodiment, this can include determining, for each remediation scenario, prices associated with products associated with the remediation scenario and return on investment (ROI) for those products over time. Many other types of conversions and calculations can also be performed at this stage.

Once the output data is converted into customer facing data, home energy audit application 106 can generate a report summarizing the customer facing data at block 312. With this report, the customer is provided with detailed, accurate, and useful results that he/she can use to understand the energy efficiency profile of the home and to make informed decisions regarding potential home improvements.

Additional details regarding the processing performed at each of the blocks of FIG. 3, along with other features and advantages of the present invention, are provided in the sections below.

Receiving User Inputs

As described with respect to block 302 of FIG. 3, home energy audit application 106 is configured to initially collect various inputs from a user (e.g., an auditor) that correspond to information about a home being audited. In a particular embodiment, these inputs can be collected by presenting to the auditor a series of graphical user interfaces as shown in FIGS. 4-30. These user interfaces are designed to organize all of the information needed by the application in a logical and stepwise fashion, as well as to minimize the amount of time expended by the auditor for data entry.

FIG. 4 is an example "site audit status" user interface 400 that enables the auditor to view, at a glance, a list all of the data entry screens of home energy audit application 106 and a completion status (i.e., "complete" or "incomplete") of each screen. The completion status indicates whether the required information on that screen has been fully entered. This feature ensures that the auditor is aware of where he/she is in the data entry process, and what information still needs to be entered in order to move on to the data analysis (i.e., simulation run) phase of the audit. As shown, each screen listing is hyperlinked, thereby allowing the auditor to navigate directly to a particular screen to complete data entry. In one embodiment, user interface 400 can be persistently displayed to the auditor in, e.g., a sidebar area of the auditor's client display.

Figure 5:
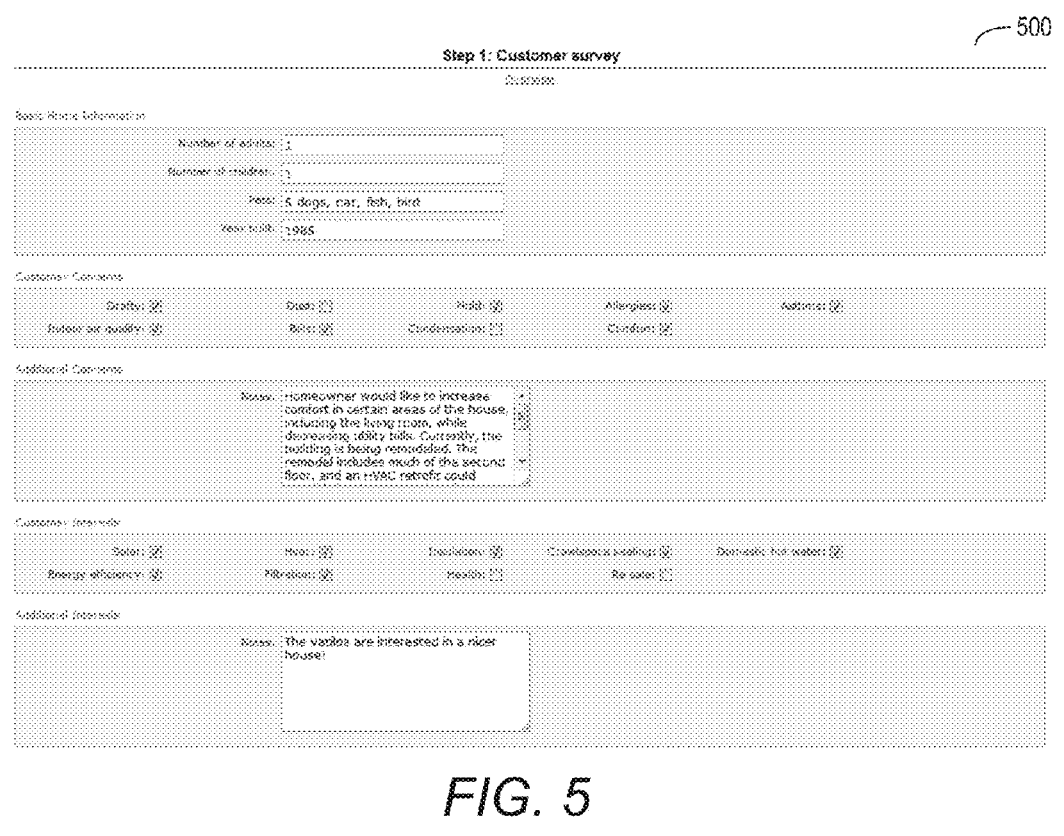

FIG. 5 is an example graphical user interface 500 that enables the auditor to enter general information about the customer(s) of the audit (e.g., the homeowners). In one embodiment, this information can be used to tailor the final report generated at the conclusion of the audit to the particular concerns and interests expressed by the customer.

FIGS. 6 and 7 are example graphical user interfaces 600 and 700 that enable the auditor to enter general construction information about the home being audited. This information can include overall area (in square feet), number of bedrooms, number of bathrooms, number of floors, type of plumbing, type of wiring, etc.

Figure 8:
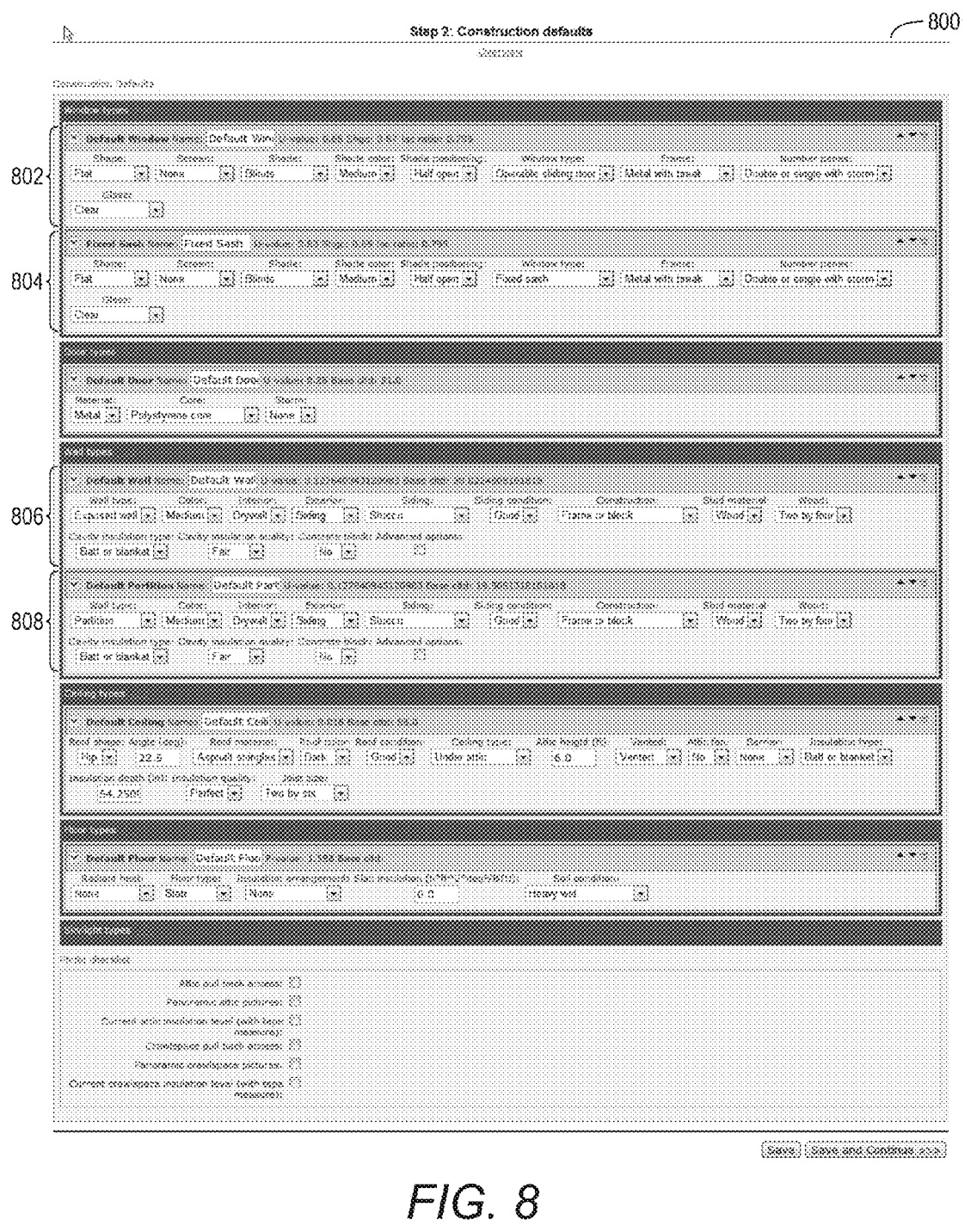

FIG. 8 is an example graphical user interface 800 that enables the auditor to define construction surface descriptions (i.e., "construction defaults") for the home. These construction surface descriptions can be understood as type definitions for various construction elements that are typically found in residences (e.g., window, floor, wall, ceiling, floor, skylight, etc.). Each construction surface description includes one or more attributes that identify characteristics of the construction element type being defined; these attributes can vary based on the construction element. For example, for windows, the auditor can define a construction surface description that includes attributes such as shape, screen, shade, shade positioning, and so on. As another example, for doors, the auditor can define a construction surface description that includes attributes such as material, core, and whether the door type is a storm door.

In one embodiment, multiple construction surface descriptions can be defined for a single construction element. For instance, in the example of FIG. 8, two construction surface descriptions "Default Window" (802) and "Fixed Sash" (804) have been defined for the window construction element. Similarly, two construction surface descriptions "Default Wall" (806) and "Default Partition" (808) have been defined for the wall construction element. Thus, the auditor can create separate construction surface descriptions to cover every type of window, door, wall, etc. found in the home. As discussed in further detail below, the construction surface descriptions created in user interface 800 are leveraged later in the data entry process to facilitate the definition of two-dimensional layouts of the home.

In certain embodiments, the user interface for defining a construction surface description can include an ordered series of drop-down lists, where each list input acts as a filter to dynamically modify the remaining drop-down lists in the series. For example, for the window construction element, if the auditor selects, via the "shade" drop-down list, a value of "blinds," "roller shades," or "drapes," user interface 800 will dynamically generate additional drop-down lists for choosing shade positioning and shade coloring. On the other hand, if the auditor selects "none" for the "shade" drop-down list, those additional shade options will not appear. This dynamic design simplifies the definition process and helps ensure that the auditor selects the right attributes for a given construction surface description. FIGS. 9-14 are trees 900-1400 that illustrate, for the window, door, wall, ceiling, floor, and skylight elements respectively, which drop-down lists are displayed (and the values shown in each list) based on the auditor's inputs. The lighter colored boxes correspond to drop-down lists and the darker colored boxes correspond to values shown/selected in a given list.

Figure 15:
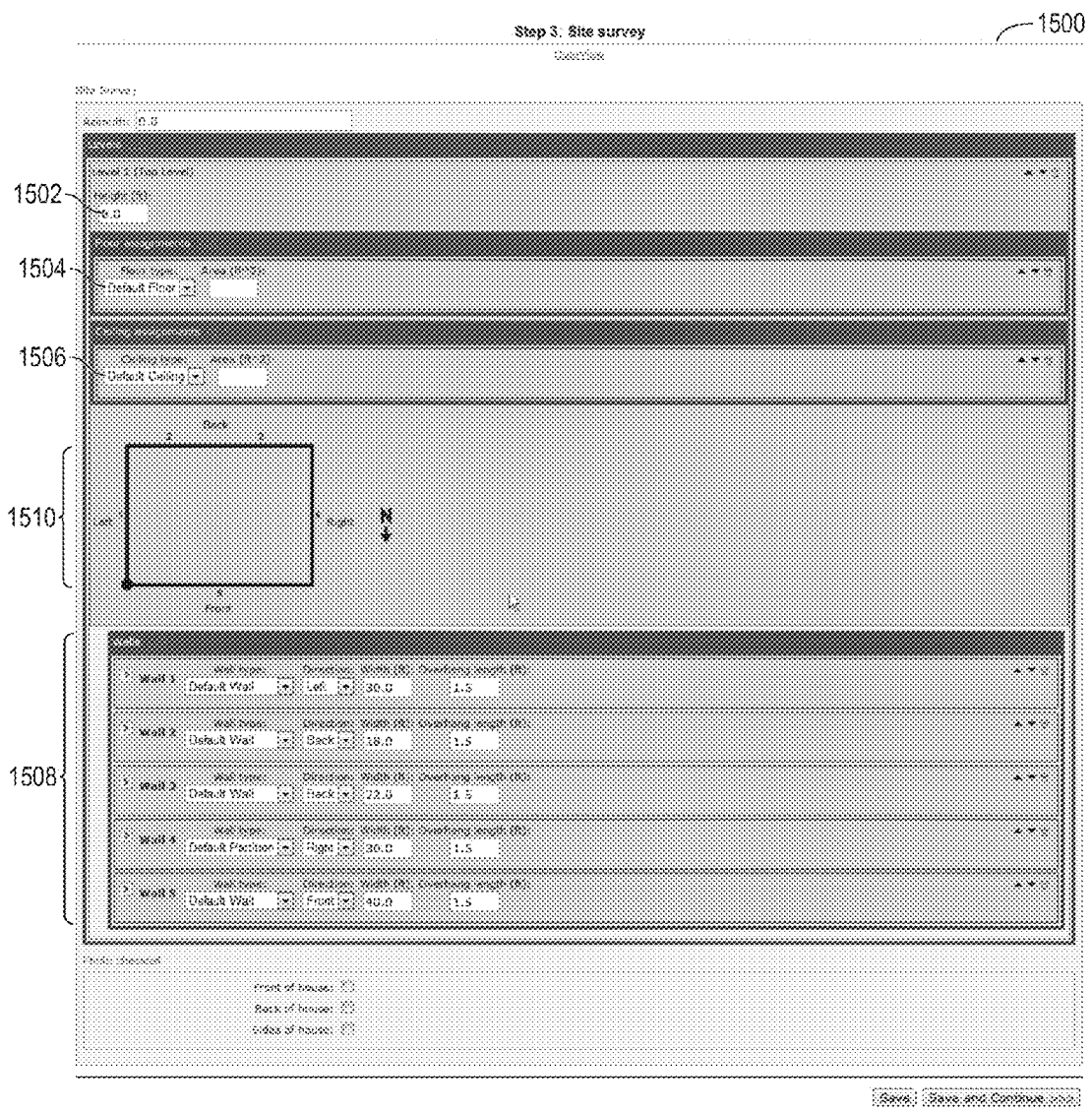
FIG. 15 is an example of a graphical user interface for entering site survey (e.g., two-dimensional layout) information according to an embodiment of the present invention.

FIG. 15 is an example graphical user interface 1500 that enables the auditor to enter site survey information (e.g., two-dimensional floor plans or layouts) for the home. As shown, this information is entered by providing a level height 1502, assigning a floor type 1504, assigning a ceiling type 1506, and then defining various walls with corresponding wall type assignments (1508). The resulting layout is depicted in area 1510. In one embodiment, the types that can be assigned to the walls, ceilings, and floors are based on the construction surface descriptions defined in user interface 800 of FIG. 8. Thus, if two construction surface descriptions were defined for the floor construction element, these two descriptions would appear as choices for selection in the floor type drop-down list 1504. Although not explicitly shown in FIG. 15, user interface 1500 can be used to specify various other types of construction elements in the layout, such as windows, doors, and the like. In addition, user interface 1500 can be used to specify multiple layouts, each corresponding to a different level or floor of the home. These layouts can be processed by home energy audit application 106 prior to the data simulation phase to generate a three-dimensional model of the home.

As an alternative to manually entering two-dimensional layout information as described above with respect to user interface 1500, in certain embodiments application 106 can include a facility to import this information as, e.g., an XML file from an external computer-aided design (CAD) or other drawing program. In this scenario, the auditor may still use user interface 1500 (or a similar interface) to assign construction surface descriptions to the construction elements defined by the imported data.

Figure 16:
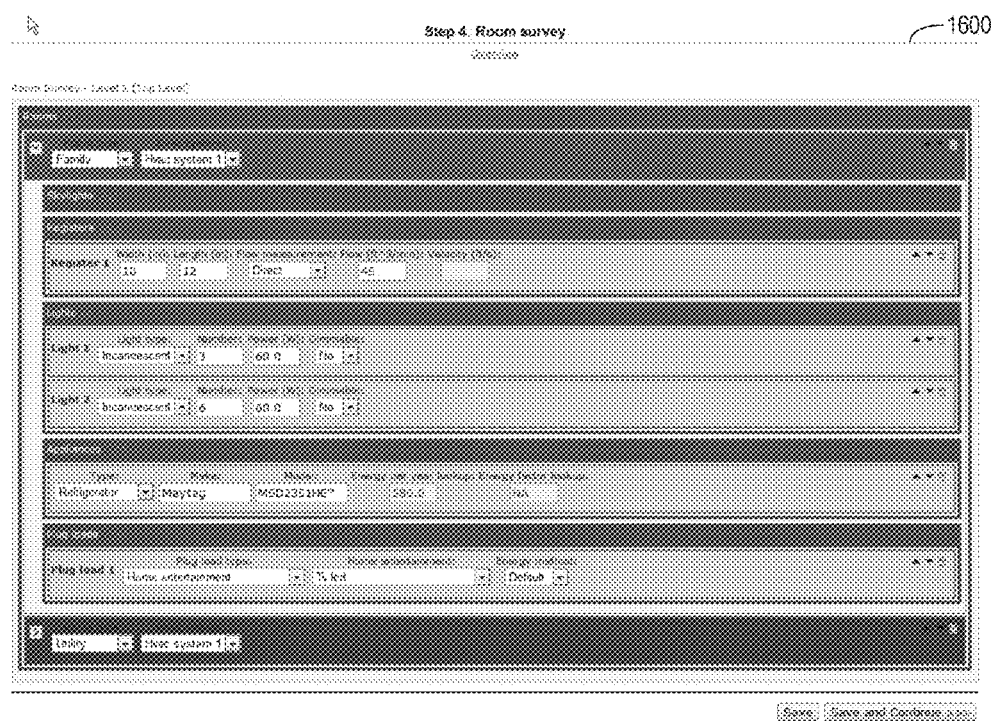
FIG. 16 is an example of a graphical user interface for entering room survey information according to an embodiment of the present invention.

FIG. 16 is an example graphical user interface 1600 that enables the auditor to enter room survey information that specifies data relevant to the energy profile of each room in the home. For example, as shown, this data can include register data, the number and types of lights, appliances, and plug loads. By collecting such room survey information, energy expenditure can be calculated on a per room basis, which may be of interest to the customer.

In one embodiment, the process of entering appliance information in user interface 1600 can simply involve entering the make and model of each appliance. Home energy audit application 106 can then query an external or internal appliance database (such as appliance database 114 of FIG. 1) in order to automatically retrieve detailed specifications for the appliance. This significantly simplifies the auditor's workflow, as he/she does not need to be personally knowledgeable regarding the energy characteristics of a wide range of appliances, or need to manually look up such information.

FIGS. 17, 18A, 18B, and 18C are example graphical user interfaces 1700, 1800, 1810, and 1820 that enable the auditor to enter the results of various diagnostic tests performed on the home. In particular, user interface 1700 enables the entry of results from a blower door test, which measures air infiltration into the home. And user interfaces 1800, 1810, and 1820 enable the entry of duct system information and the results from a duct blaster test, which measures air leakage in the duct system. In certain embodiments, energy simulation engine 108 may not be configured to perform a yearly energy simulation of duct leakage. In these cases, the duct system information in FIGS. 18A-18C may still be collected, and home energy audit application 106 may run its own series of calculations/simulations to estimate duct system losses over the course of a year.

FIGS. 19A, 19B, 20, and 21 are example graphical user interfaces 1900, 1950, 2000, and 2100 that enable the auditor to enter information regarding various pieces of mechanical equipment in the home. In particular, user interfaces 1900 and 150 enable the entry of heating and cooling (i.e., HVAC) equipment information, user interface 2000 enables the entry of water heater information, and user interface 2100 enables the entry of pool, hot tub, and pool pump information. Like the appliance entry fields of user interface 1600, the equipment entry fields of user interfaces 1900, 1950, 2000, 2100, and 2000 can be configured to simply require the make and model of each piece of equipment. Home energy audit application 106 can then query an external or internal database (such as appliance database 114 of FIG. 1) in order to automatically retrieve detailed specifications for the equipment.

Figure 22A:
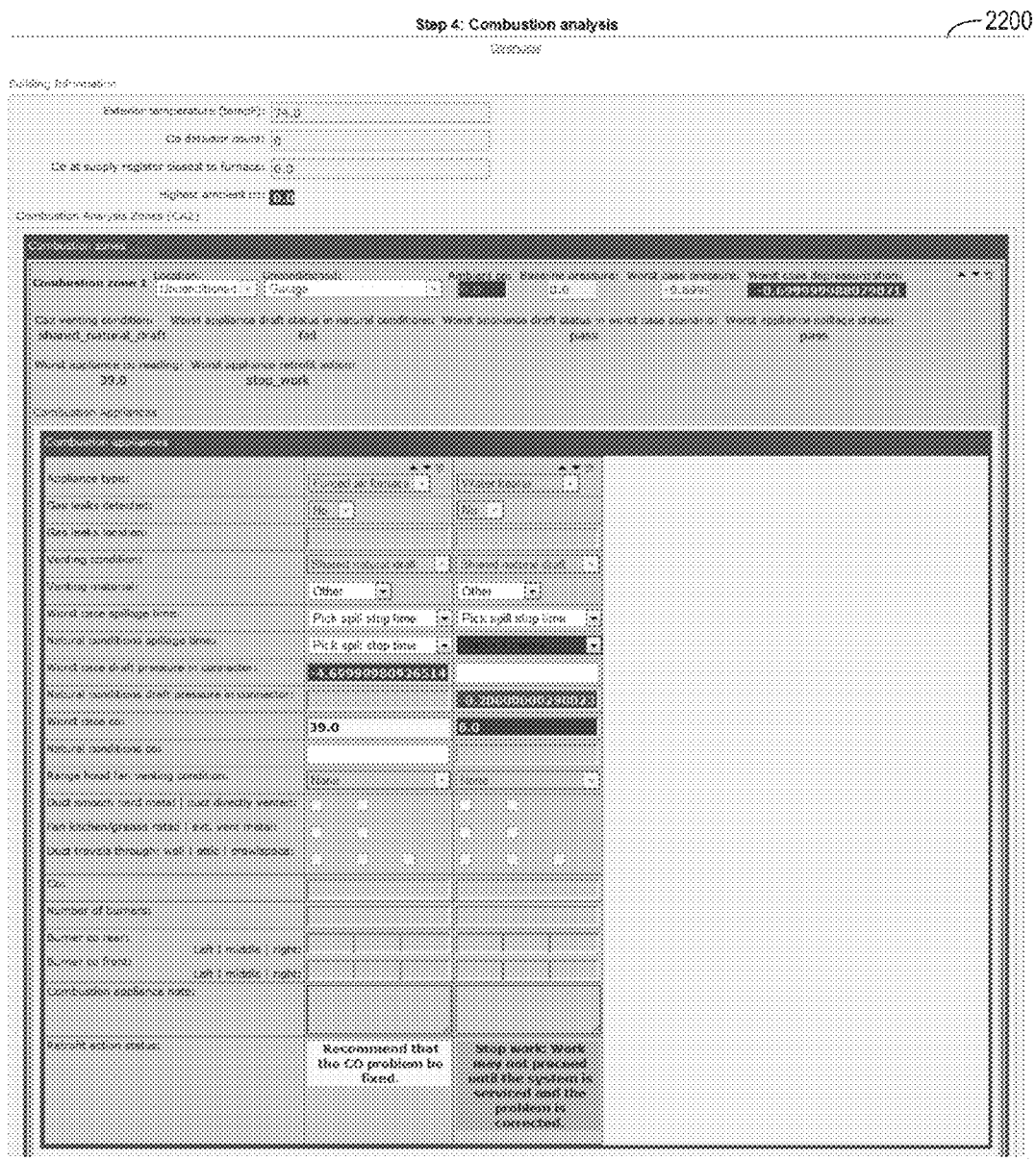
FIGS. 22A and 22B are examples of graphical user interfaces for entering combustion analysis information according to an embodiment of the present invention.
Figure 22B:
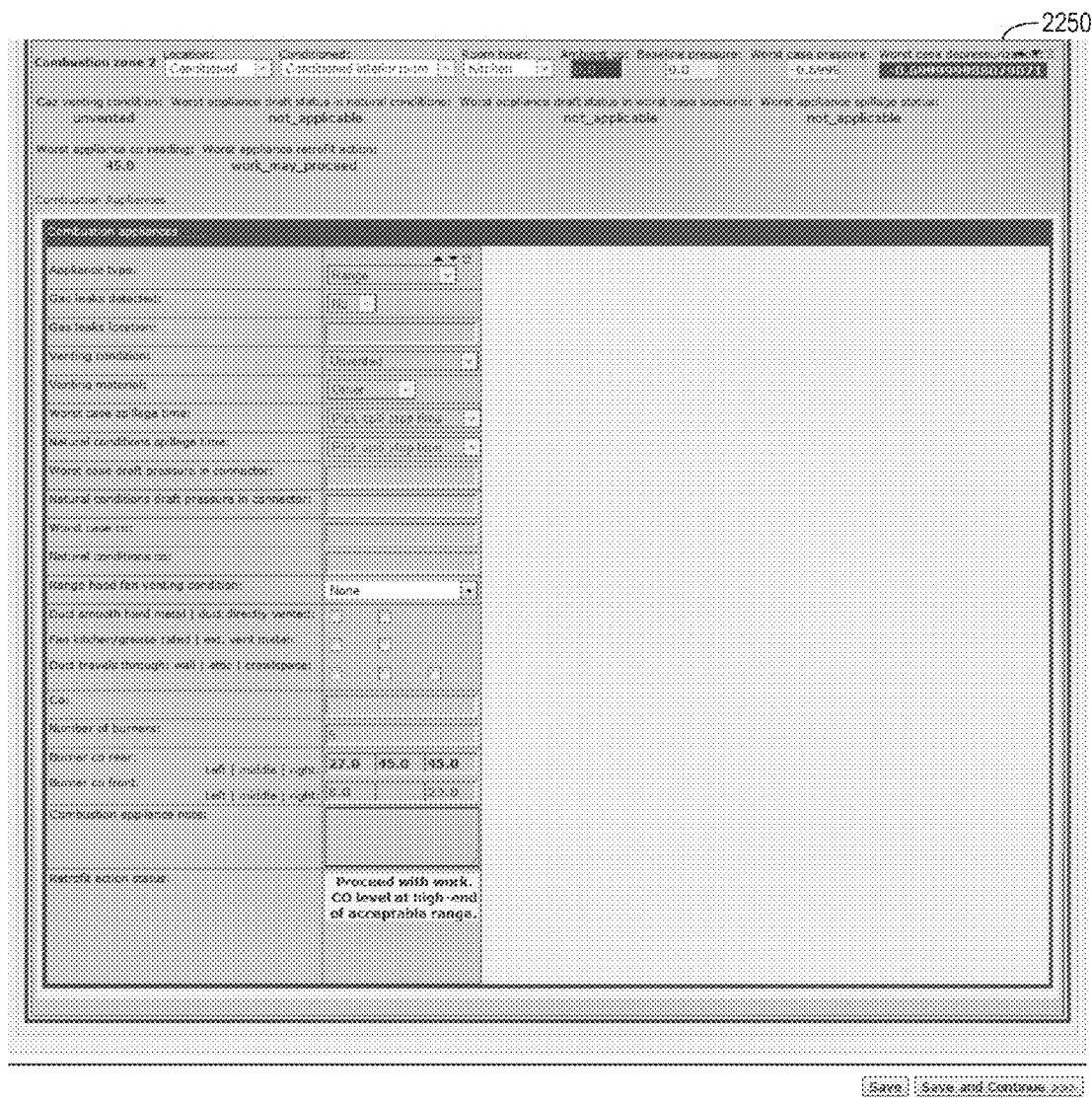
Figure 23:
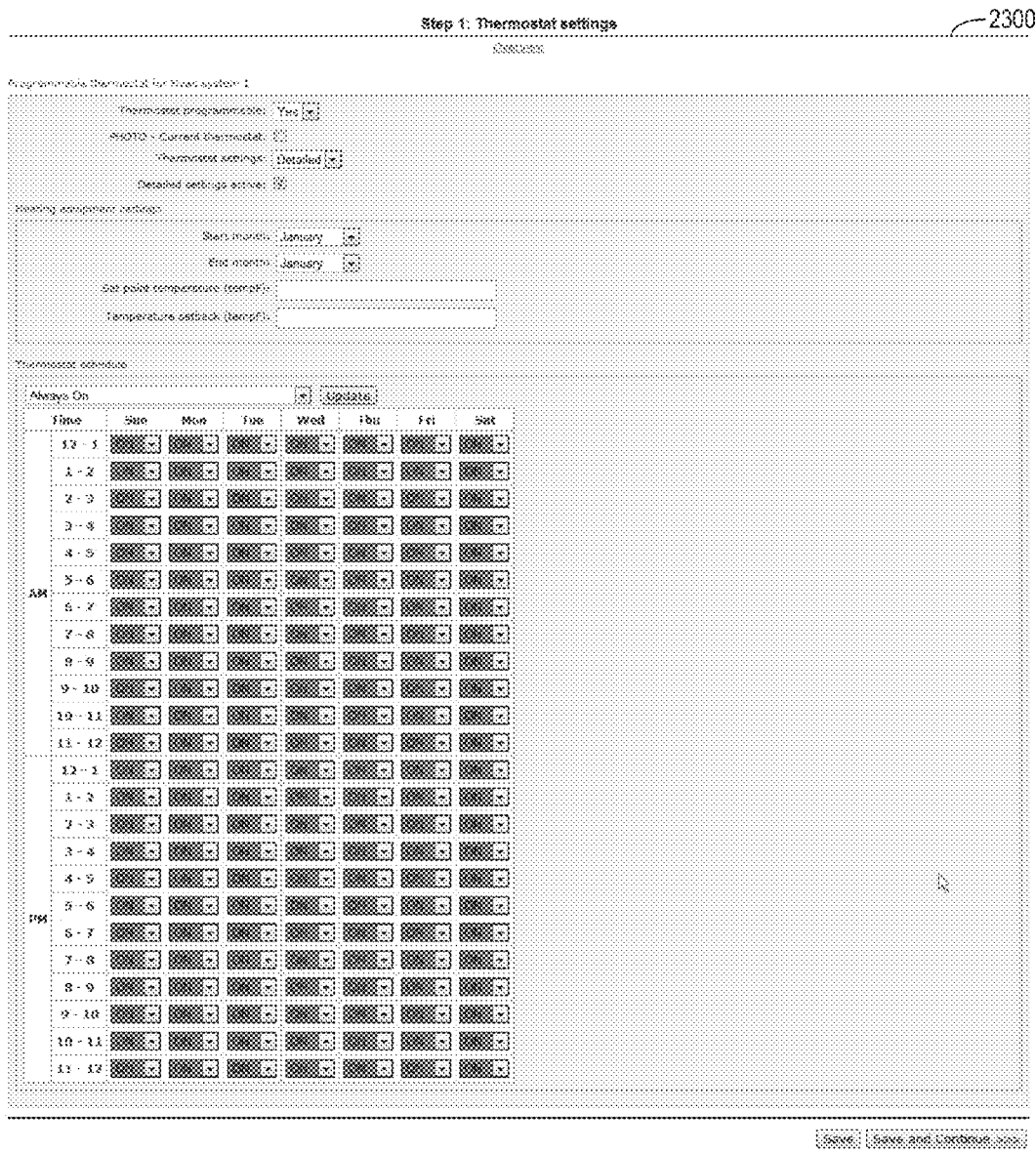
FIG. 23 is an example of a graphical user interface for entering thermostat settings according to an embodiment of the present invention.

FIGS. 22A and 22B are example graphical user interfaces 2200 and 2250 that enable the auditor to enter information regarding combustion appliances (e.g., gas furnace, water heater, gas range) in the home. This information can then be analyzed in an interactive manner to provide the auditor feedback about the safety of these appliances. For example, application 106 can determine, based on the auditor's inputs, whether a particular combustion appliance has a carbon monoxide (CO) spillage problem. If so, application 106 can identify this problem in user interfaces 2200 and 2250 and recommend that further work be halted until the problem is corrected. If no CO problem is found, application 106 can indicate, via user interfaces 2200 and 2250, that the combustion appliance is safe and work can proceed.

FIGS. 23-27 are example graphical user interfaces 2300-2700 that enable the auditor to enter information regarding the homeowner's usage of energy in the home. In particular, user interface 2300 enables the entry of typical thermostat settings throughout a day, user interface 2400 enables the entry of typical hot water demand for each individual in the home, user interface 2500 enables the entry of typical appliance usage (per room and appliance), user interface 2600 enables the entry of typical plug loads (per room and plug load), and user interface 2700 enables the entry of typical lighting schedules (per room and light type). These inputs capture the homeowner's behavior and can be used to provide the homeowner with a personalized view of how that behavior affects their energy usage. If the customer of the audit is not interested in this personalized information, the inputs in user interfaces 23-27 can be defaulted with standard or average values.

Figure 28A:
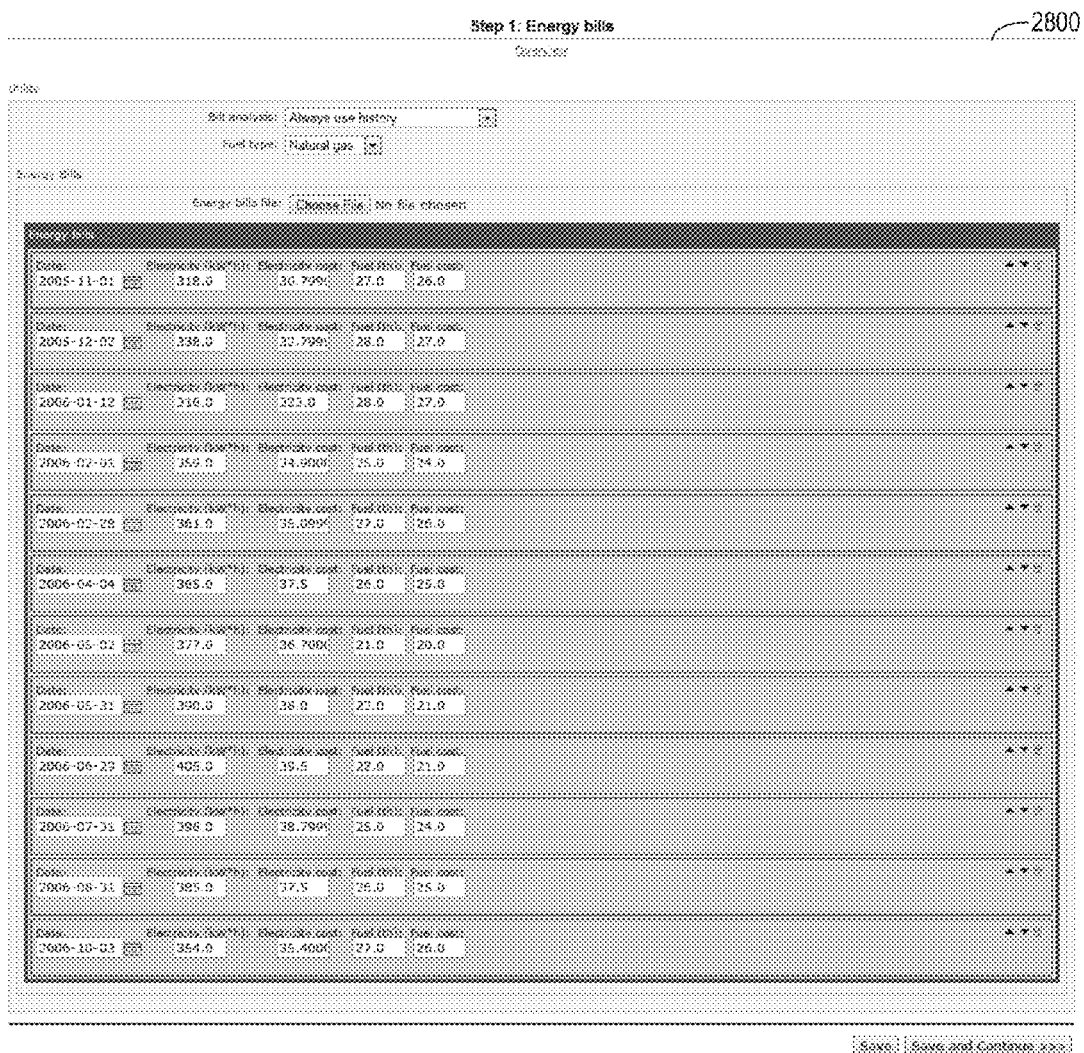
FIGS. 28A and 28B are examples of graphical user interfaces for entering homeowner energy bill data according to an embodiment of the present invention.
Figure 28B:
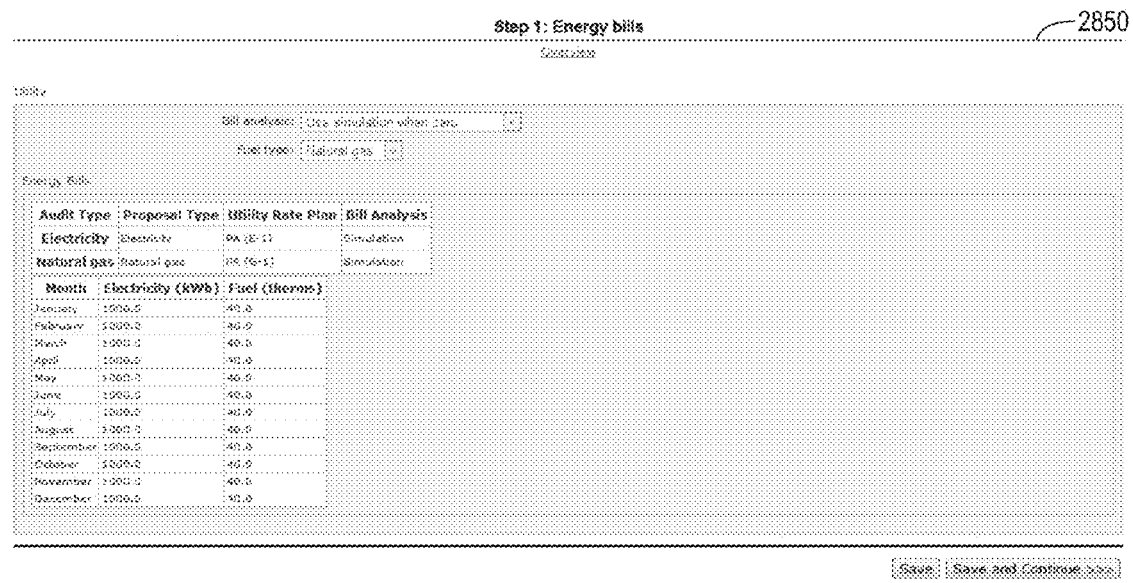

FIGS. 28A and 28B are example graphical user interfaces 2800 and 2850 that enable the auditor to enter historical energy bill data for the homeowner. As shown, this data can be broken down by energy type (e.g., electricity or fuel) and by monthly usage per energy type. As described in further detail below, home audit energy application 106 can use the provided energy bill data to scale the outputs of the simulations performed by energy simulation engine 108 to more accurately reflect the homeowner's past energy usage trends. In one embodiment, application 106 can include a facility to import energy bill data from an external source (e.g., a data file or another application), rather than requiring the auditor to manually enter this information via user interfaces 2800 and 2850.

Figure 29:
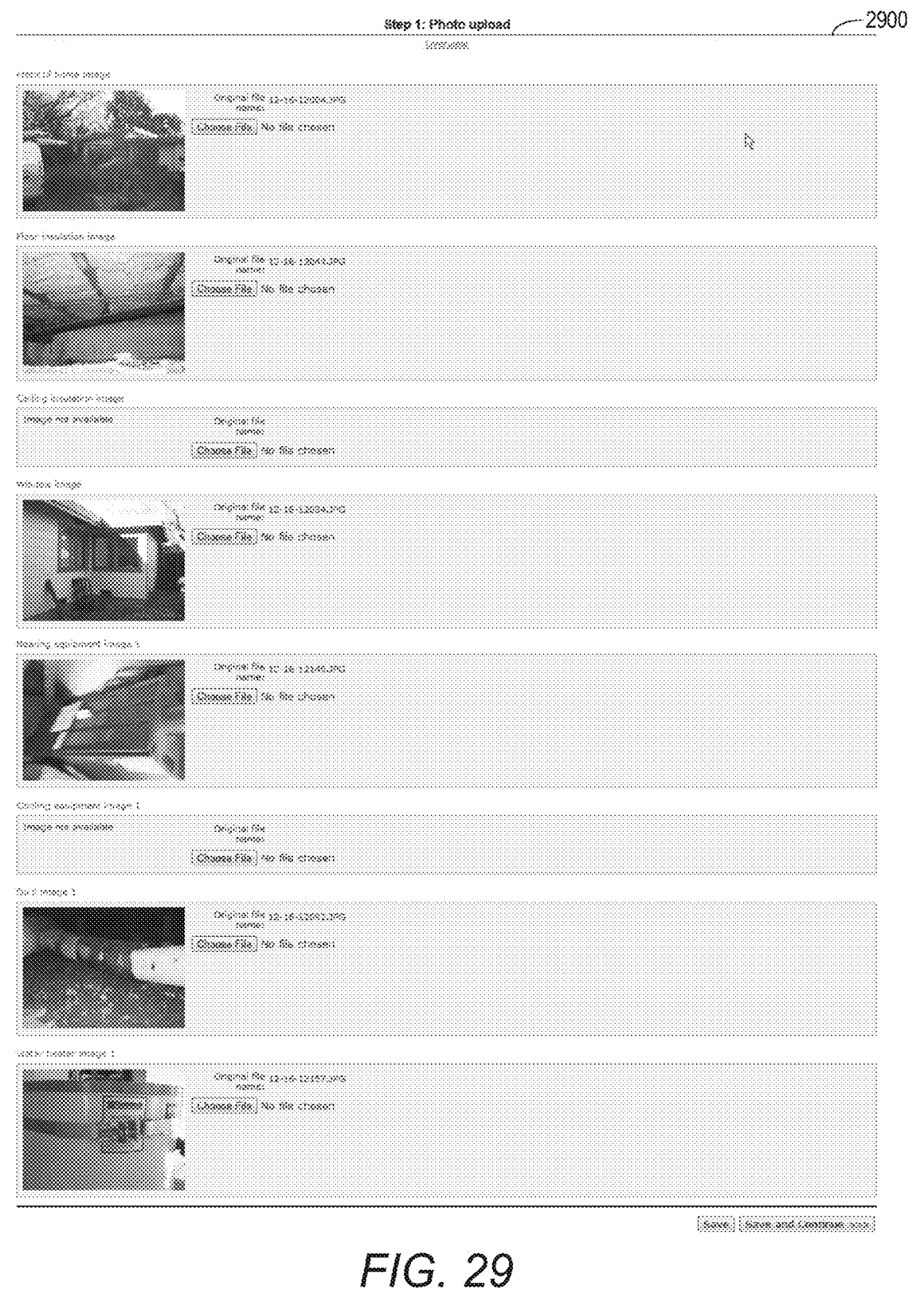
Figure 30:
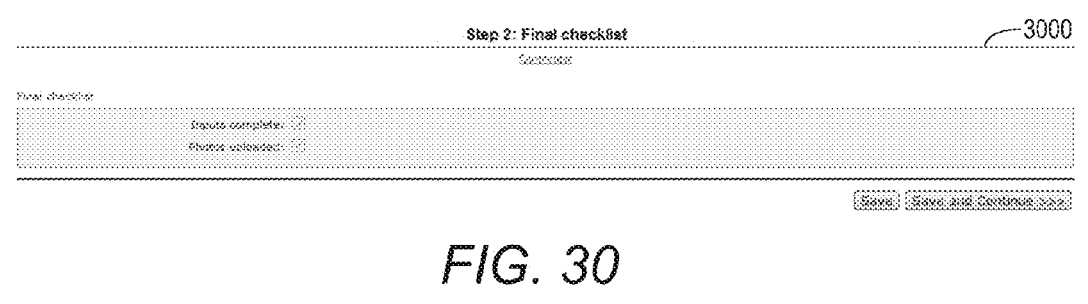

FIGS. 29 and 30 are example user interfaces 2900 and 3000 that enable an auditor to finalize the data entry phase of the audit process. In particular, user interface 2900 enables the uploading of one or more house photos that can be used in the audit report generated for the customer of the audit. And user interface 3000 allows the auditor to view and/or indicate whether all data inputs are complete.

Converting User Inputs into Input Data for the Energy Simulation Engine

Per block 304 of FIG. 3, once all inputs have been received from the auditor, home energy audit application 106 can convert the inputs into input data that is appropriate for consumption by energy simulation engine 108. An example of such an engine is the Department of Energy's EnergyPlus program. Generally speaking, EnergyPlus is a sophisticated tool that enables very accurate modeling of energy flows throughout a building. However, EnergyPlus is also very specialized and requires, as input, building specifications and other details (e.g., three-dimensional building coordinates, physical layer properties such as conductivity, specific heat, density, etc.) that would be very difficult, if not impossible, for most auditors to compile and format within a reasonable period of time. Accordingly, certain embodiments of the present invention facilitate the conversion of auditor inputs into EnergyPlus compliant input data, thereby allowing the auditor to reap the benefits of using such a sophisticated simulation engine without expending the time and effort to learn how to interact with the engine.

Figure 31:
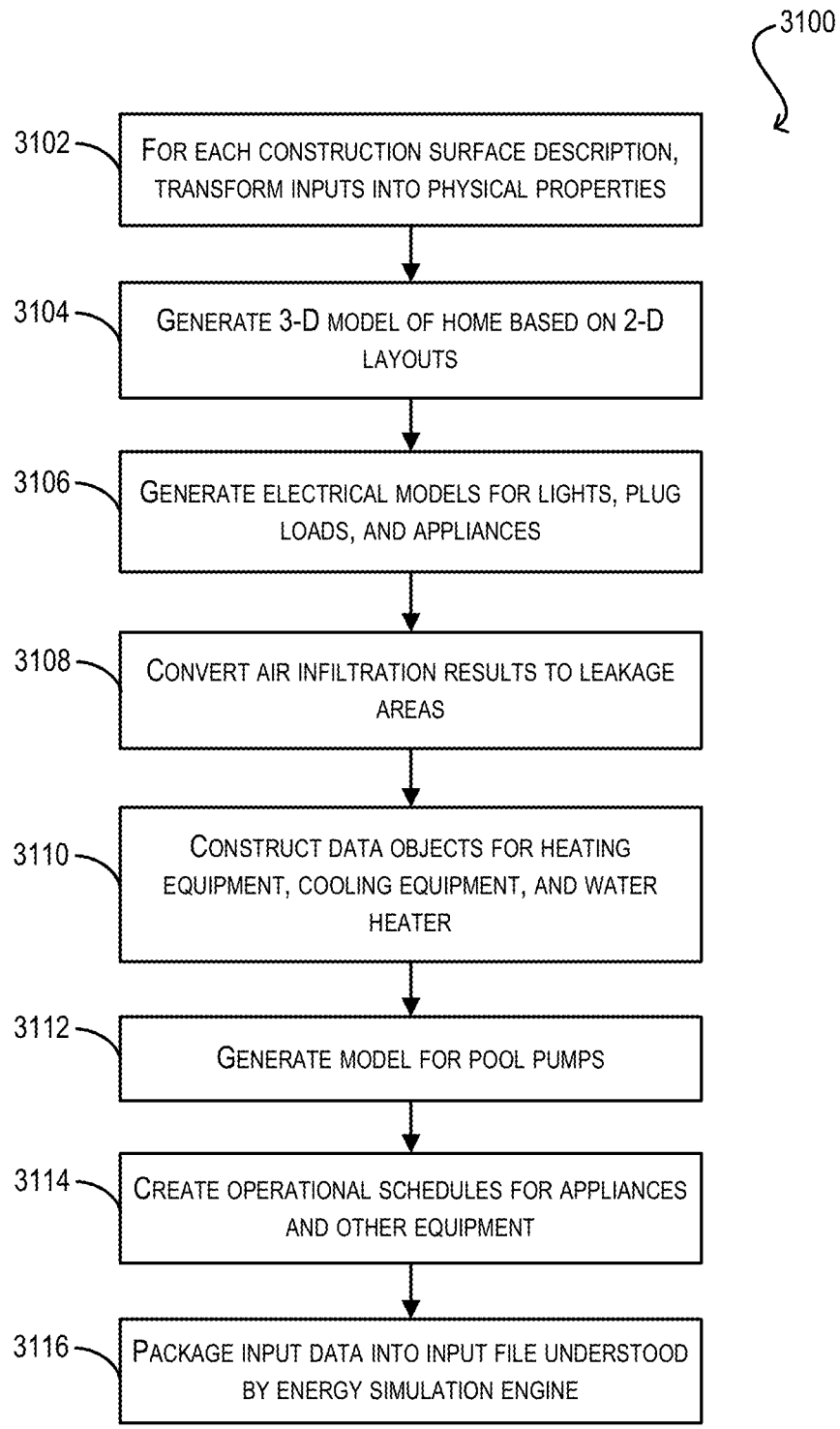
FIG. 31 is a flow diagram illustrating a process for converting user inputs into input data for an energy simulation engine according to an embodiment of the present invention.

FIG. 31 illustrates a process 3100 that can be performed by home energy audit application 106 to carry out this conversion process. At block 3102, application 106 can, for each construction surface description defined via user interface 800 of FIG. 8, transform the auditor's inputs into physical properties that are understood by energy simulation engine 108. This transformation process can vary depending on the construction element that the construction surface description applies to. For example, for windows and skylights, the auditor-specified window or skylight type can be looked up in a set of tables from the ASHRAE Handbook of Fundamentals to determine, e.g., corresponding U-Value and SHGC values of the construction element.

For doors, walls, ceilings, and floors, the auditor-specified attributes of an opaque type can be converted into a series of layers with specific physical properties. In particular, the exterior and interior of each opaque type can be looked up in a series of tables to identify a corresponding layer and associated physical properties. Further, the middle portion of each opaque type can be transformed according to the attributes of the type—for instance, uniform types can be looked up in reference tables, while composite types such as wood frame construction can use averages based on the volume ratios of the composite parts. Types of insignificant mass can be assigned a thermal resistance and roughness value from the ASHRAE Handbook of Fundamentals. Types with significant mass can be assigned a thickness, conductivity, density, specific heat, thermal absorptance, solar absorptance, and visible absorptance from the ASHRAE Handbook.

At block 3104, home energy audit application 106 can generate a three-dimensional model of the home based on the two-dimensional layouts defined via user interface 1500 of FIG. 15. In some embodiments, this three-dimensional model can be required by energy simulation engine 108 in order to properly simulate heat flows and other physical phenomena throughout the home. The model generation process can include modeling each floor or level of the home by converting the level's two-dimensional layout into three-dimensional (x, y, z) coordinates, and assigning, to each surface of the level, a construction surface description (based on the assignments entered in user interface 1500). The process can further include using polygon clipping to stack the levels on top of each other, and to determine where ceilings and floors are exposed to the environment. In one embodiment, additional zones can be created for attics and crawlspaces. Further, a straight skeleton algorithm can be applied to construct a roof (e.g., a hip roof) using overhang inputs. Rooms and walls of the home can then be matched using polygon clipping. If room layouts are unknown (e.g., were not entered by the auditor), a grid can be constructed and rooms can be distributed evenly.

At block 3106, electrical models can be generated for lights, plug loads, and household appliances specified via user interface 1600 of FIG. 16.

Figure 17:
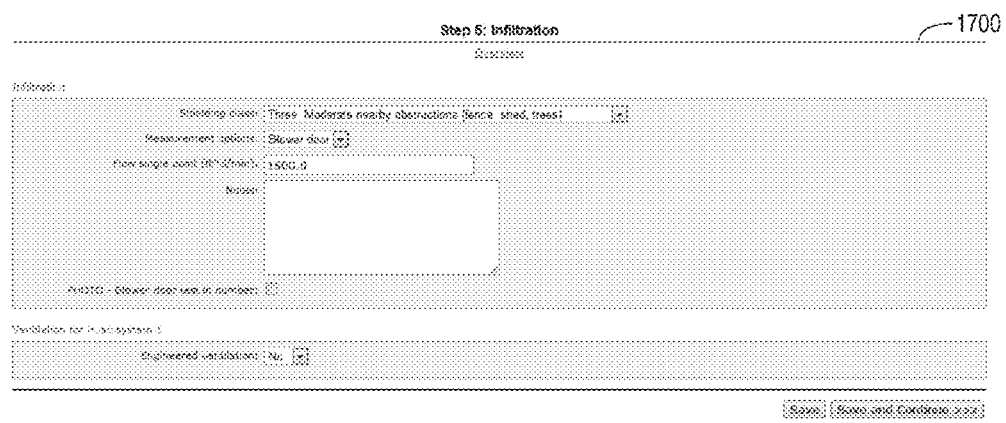
FIG. 17 is an example of a graphical user interface for entering air infiltration results according to an embodiment of the present invention.

At block 3108, the air infiltration results entered via user interface 1700 of FIG. 17 can be converted into leakage areas for calculation with stack coefficients and wind coefficients.

Figure 19A:
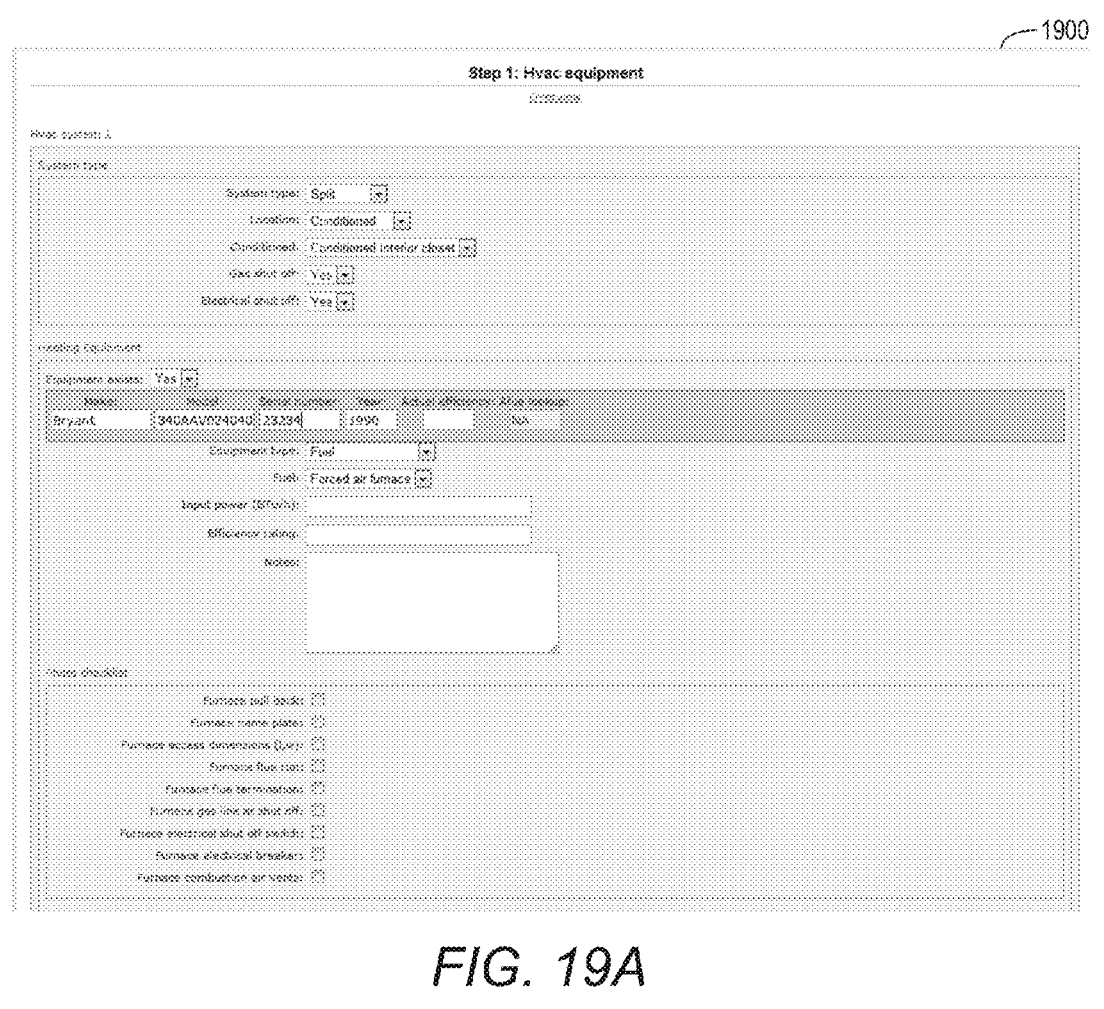
Figure 19B:
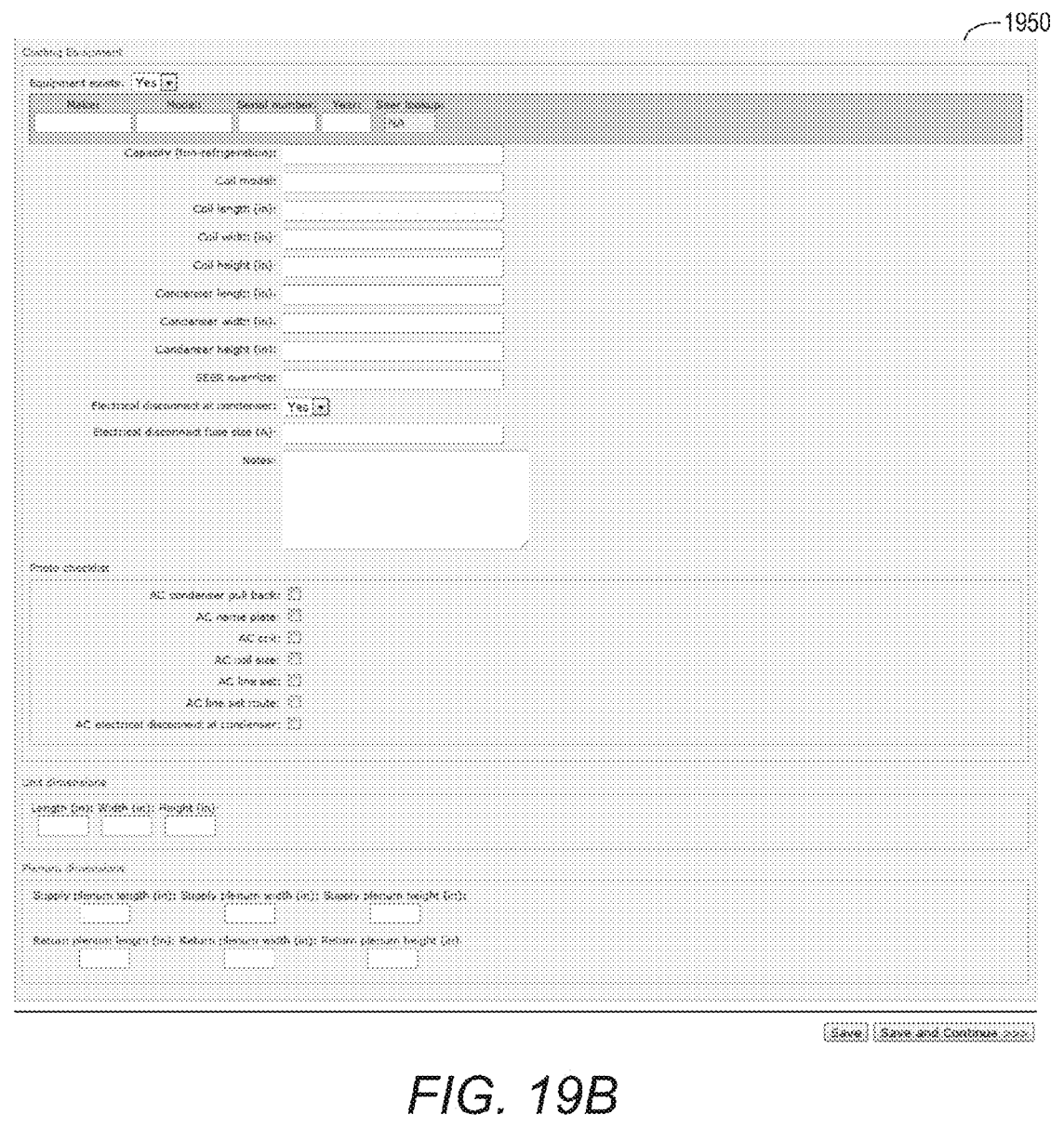
Figure 20:
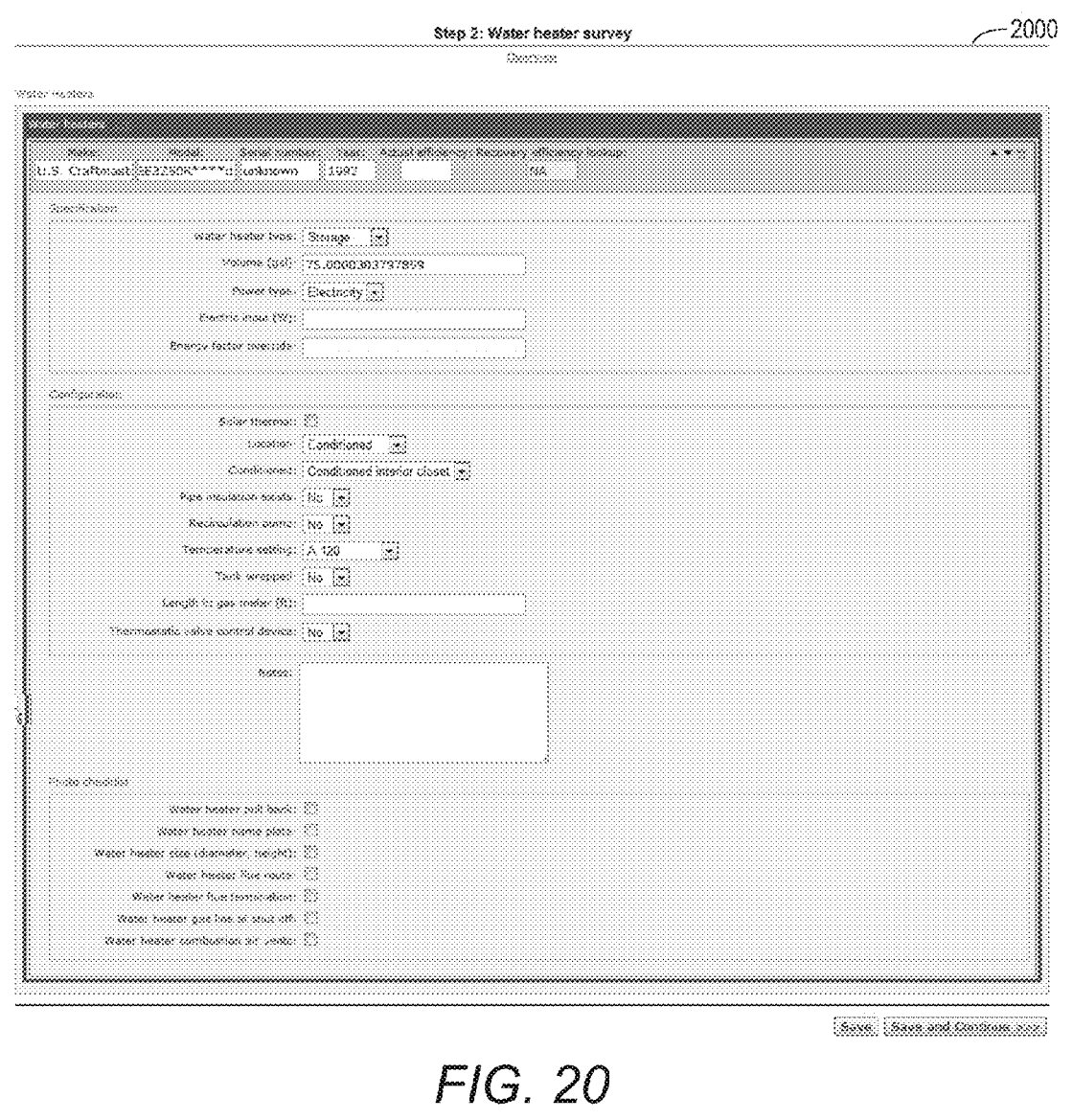

At block 3110, data objects can be constructed for the heating, cooling, and water heater information entered via user interfaces 1900, 1950, and 2000 of FIGS. 19A, 19B, and 20. These objects can be populated based on both the auditor's inputs, as well as information retrieved from an appliance database such as database 114 of FIG. 1. In one embodiment, any missing data can be filled in using vintage lookup tables.

Figure 21:
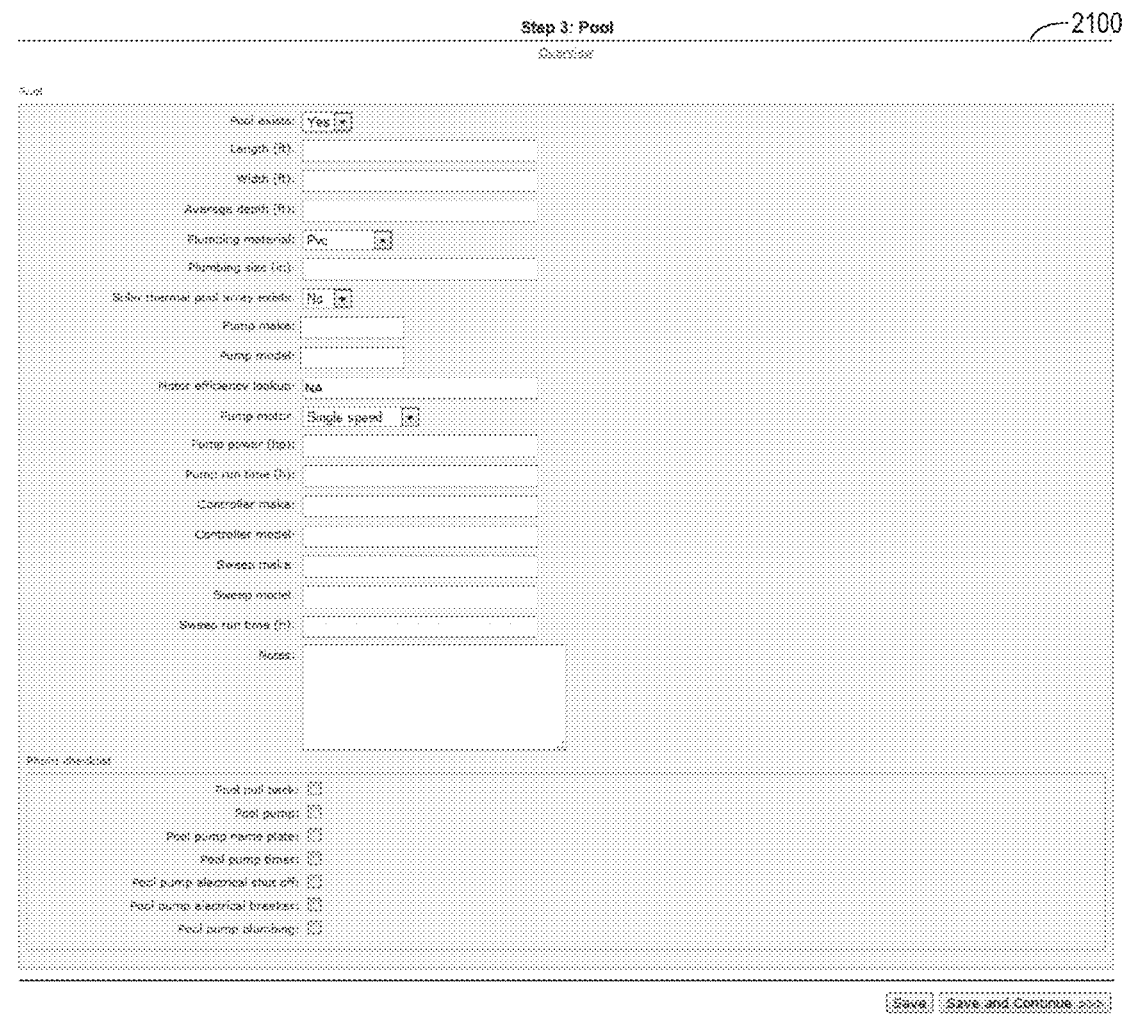

At block 3112, any pool pumps entered via user interface 2100 of FIG. 21 can be modeled according to power curve factors and flow ratings.

At block 3114, operational schedules can be created for each of the appliances and pieces of mechanical equipment (e.g., heating, cooling, etc.) entered via user interfaces 1600, 1900, 1950, 2000, and 2100 of FIGS. 16, 19A, 19B, 20, and 21. Generally speaking, these schedules can be defaulted to generic timing schedules, unless the auditor has entered specific homeowner usage information via user interfaces 2300-2700 of FIGS. 23-27. In the case where such homeowner usage information is available, they can take precedence. Examples of operational schedules that can be created at this step include electrical appliance schedules, a water heater schedule, a thermostat schedule, and more.

Finally, at block 3116, all of the input data generated via the preceding steps of process 3100 can be packaged into an input data file for use by energy simulation engine 108. In one embodiment, this input data file can be an IDF file as used by EnergyPlus. Other types of files and formats can also be supported. Upon generating the input data file, energy simulation engine 108 can be invoked to run a simulation scenario based on the information encapsulated in the file. In certain embodiments, as part of this invocation process, home energy audit application 106 can pass to energy simulation engine 108 weather station data for the home, which is used by engine 108 to model weather patterns around the home over the course of a simulated year. The location of the closest weather station can be determined by calculating the geospatial distance between the home and a list of available weather stations by geocoding the homes latitude and longitude using external geocoding services (such as geocoding services 112 of FIG. 1). In further embodiments, home energy audit application 106 can configure energy simulation engine 108 at the time of invocation such that the engine output data is reported on an hourly basis to facilitate post-processing (described below).

Running Multiple Simulation Scenarios

Figure 32:
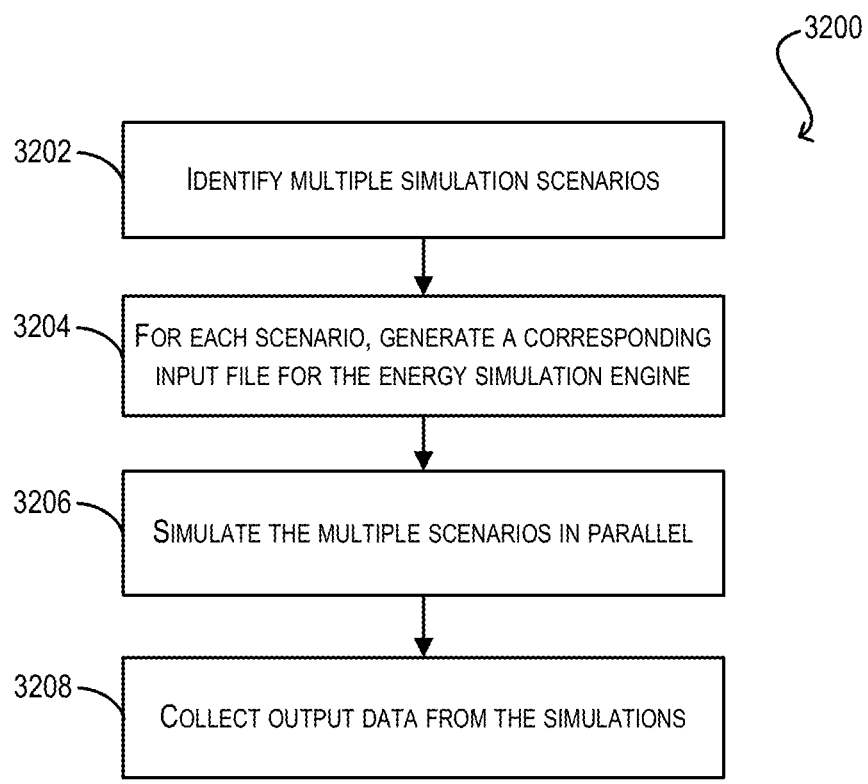
FIG. 32 is a flow diagram illustrating a process for running multiple simulation scenarios according to an embodiment of the present invention.

As described with respect to block 306 of FIG. 3, in certain embodiments home energy audit application 106 can run multiple simulation scenarios for a single home in parallel. In other words, application 106 can effectively invoke energy simulation engine 108 multiple times, each with a different input data file. This can be useful for modeling a number of different remediation scenarios (i.e., scenarios where a specific remediation measure has been implemented, such as the installation of a new, high efficiency gas furnace) in order to determine the likely energy savings for each scenario. FIG. 32 illustrates a process 3200 that can be performed by home energy audit application 106 for running multiple simulation scenarios according to an embodiment of the present invention. Process 3200 can be performed after the conversion process of FIG. 31 has been completed.

At block 3202, home energy audit application 106 can identify a list of simulation scenarios to be run. Generally speaking, this list will include a base scenario that reflects the home "as is," and several remediation scenarios that reflect possible improvements to the home. Each remediation scenario can be associated with one or more products (e.g., a new water heater, a new gas furnace, new insulation, new windows etc.) and or services. In a particular embodiment, the remediation scenarios that are identified at block 3202 can be based on a preconfigured database of products that are approved by the homeowner's utility company, or that are preferred and/or available for installation by the contractor that will be doing the improvement work.

At block 3204, home energy audit application 106 can, for each scenario identified at block 3202, generate a corresponding input data file for energy simulation engine 108. For the base scenario, a new input data file does not need to be created since the file generated at block 3116 of FIG. 31 can be used. For each remediation scenario, a new input data file can be generated that includes one or more modifications to the input data file for the base scenario (i.e., the base input data file). The following table includes a list of possible remediation scenarios, along with the modification(s) that would be performed to the base input data file in order to implement the remediation.

TABLE 1

| Remediation Scenarios | |
|---|---|
| Remediation Scenario | Modification(s) to Base Input Data File |
| Air sealing | Decrease blower door test number by a configured amount to account for decreased air infiltration. In one embodiment, this decrease is 20%, but is limited by a minimum of 0.35 air changes per hour (for safety reasons). |
| Duct sealing | Decrease duct blaster test number to a value that represents a sealed duct system. In one embodiment, the new value is 15% of the blower flow. |
| Pipe insulation | Decrease water heater shell losses attributed to the first three feet coming off of the water heater to represent the installation of pipe insulation. |
| Programmable thermostat | Modify heating and cooling equipment schedules to better match the desired set points. |
| Lighting | Replace attributes of the ten most energy intensive qualifying lights with attributes representing high efficiency compact fluorescents. In one embodiment, a light qualifies for replacement if it is incandescent and not dimmable. |
| Core products | This scenario combines the air sealing, duct sealing, pipe insulation, programmable thermostat, and lighting modifications. |
| Duct replacement | Decrease duct blaster test number to a value that represents a sealed duct system AND increase insulation to represent a new duct system. In one embodiment, the new leakage value is 5% of blower flow. In addition, the insulation is raised to R-8. |
| Lighting All | Replace the attributes of all qualifying lights with attributes representing high efficiency compact fluorescents. In one embodiment, a light qualifies for replacement if it is incandescent and not dimmable. |
| Wall insulation | Increase the conductivity of the middle layer of framed walls to represent an increase in insulation. In one embodiment, the conductivity is increased to represent R-13 insulation. |
| Ceiling insulation | Increase the conductivity of the middle layer of attics to represent an increase in insulation. In one embodiment, the conductivity is increased to represent R-38 or R-49 insulation. |
| Floor insulation | Increase the conductivity of the middle layer of crawlspaces to represent an increase in insulation. In one embodiment, the conductivity is increased to represent R-19 insulation. |
| Windows | Decrease the U-Value and SHGC of each window to represent a double pane window with low-e surfaces. |
| Heating equipment | Increase the efficiency of the heating equipment to represent a high efficiency replacement. In addition, modify the total output of the heating equipment to match the appropriate load calculations for the home. In one embodiment, the efficiency is increased to 95 AFUE. |
| Cooling equipment | Increase the efficiency of the cooling equipment to represent a high efficiency replacement. In addition, modify the total output of the cooling equipment to match the appropriate load calculations for the home. In one embodiment, the efficiency is increased to 16 SEER. |
| Water heater | Increase the efficiency of the water heater and decrease the shell loss coefficient to represent a high efficiency water heater. In one embodiment, these values are increased/decreased to 96% thermal efficiency and an energy factor of 0.84. |
| Appliances | For each refrigerator, freezer, dishwasher, and clothes washer, replace the appliance's energy attributes with attributes of a more efficient make and model. In one embodiment, clothes dryers are not improved. |
| Pool pump | Replace the curve factor and flow rates with the curve factors and flow rates of a high efficient variable speed pool pump. In addition, size the pool pump to run at the minimum power and time needed to properly clean the pool. |

Once input data files for the various simulation scenarios have been generated, home energy application 106 can invoke energy simulation engine 108 multiple times (once for each input data file/scenario), thereby causing the scenarios to run in parallel (block 3206). In one embodiment, these multiple scenarios can be run on different servers, or on a single server with a large number of processing cores to handle the parallel loads.

At block 3208, output data generated by energy simulation engine 108 for each simulation run can be collected. This output data can then be post-processed and converted into customer facing data as described in further detail below.

Converting Simulation Engine Output Data into Customer Facing Data

Figure 33:
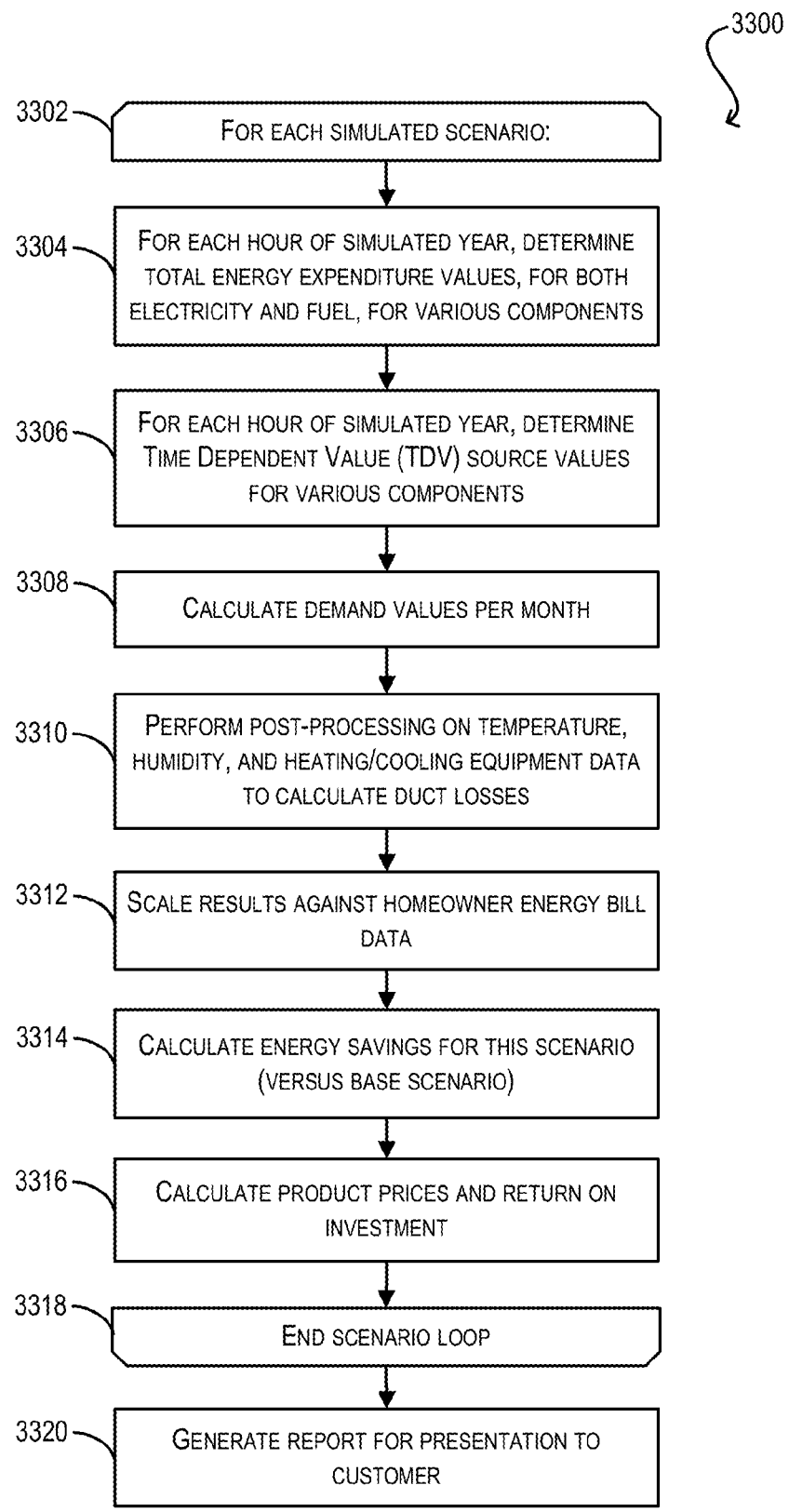
FIG. 33 is a flow diagram illustrating a process for converting energy simulation engine output into customer facing data according to an embodiment of the present invention.

Per block 310 of FIG. 3, FIG. 33 illustrates a post-processing/conversion process 3300 that can be performed by home energy audit application 106 with respect to the output data collected at block 3208 of FIG. 32. The end result of process 3300 is a report that is designed to provide detailed, accurate, and relevant audit results to a customer of the audit (e.g., the homeowner, utility company, etc.). With this post-processing and conversion, the auditor does not need to manually parse and interpret the simulation engine output to calculate metrics and data points that will be of interest to the customer; instead, this process can be completely automated. In addition, the customer can be provided with information that empowers the customer to make informed decisions regarding potential home improvements.

At block 3302, home energy audit application 106 can enter a loop for each scenario (base or remediation) simulated at block 3206 of FIG. 32. At block 3304, application 106 can begin parsing the output data for the current scenario and determine, for each hour of the simulated year, total energy expenditure values for various components in the home. These components can include, e.g., the heating equipment, the cooling equipment, the heating blower, the cooling blower, the water heater, lights, appliances, plug loads, pool pumps, and water pipes. In one embodiment, these energy expenditure values can be determined for both electricity and fuel. Further, the heating, cooling, and blower expenditure values can be broken down into the following categories to determine where the heat was gained and lost: internal gains, infiltration, duct system, wall, floor, ceiling, window, door, and skylight.

At block 3306, home energy audit application 106 can determine, for each hour of the simulated year, Time Dependent Value (TDV) source values for the components identified above. Generally speaking, TDV source values are based on production expenditure at the energy source rather than consumption at the home. Accordingly, these values are useful for determining, from the perspective of the utility company, what the energy expenditure profile of the home is. In one embodiment, TDV source values for each hour can be distributed among the various components based on expenditure ratios for that hour.

At block 3308, home energy audit application 106 can calculate demand values for each month of the simulated year. These demand values can represent the maximum power expenditure needed by the home for that month.

At block 3310, home energy audit application 106 can perform post-processing on temperature, humidity, and heating/cooling equipment expenditure data to calculate, for every hour, duct system losses. In certain embodiments, energy simulation engine 108 is not configured to perform these duct system calculations. Thus, this part of the data analysis can be performed directly by application 106. In a particular embodiment, application 106 can calculate the duct losses as a distribution efficiency using ASHRAE Standard 152 (Residential Duct System Losses). In a further embodiment, the distribution efficiency can be applied against the heating/cooling/blower output data, saved, and all totals can be adjusted to account for the duct losses.

At block 3312, home energy audit application 106 can scale the values determined at blocks 3304-3310 against the historical homeowner energy bill data entered via user interfaces 2800 and 2850 of FIGS. 28A and 28B. These scaled results represent the operational energy ratings, rather than asset energy ratings, for the home. In one embodiment, the values can be scaled differently depending on the types of the values. For example, for fuel, the water heater and heating equipment expenditure values can be scaled up or down (with a maximum scale factor of, e.g., 1.7) to match the monthly values in the homeowner's fuel bills. Similarly, heating blower values can be scaled according to the fuel scale factor. As another example, cooling equipment, cooling blower, lights, and plug loads can be scaled up or down to match the monthly values in the homeowner's electricity bills.

At block 3314, if the current scenario is a remediation (rather than base) scenario, home energy audit application 106 can process the results to determine the energy savings of the remediation scenario over the base scenario. These savings can correspond to the difference between the base scenario scaled totals and the current scenario scaled totals. In this manner, application 106 can determine the exact energy savings that may be expected if the homeowner implements the improvement(s) corresponding to the current scenario.

Further, at block 3316, application 106 can calculate prices for products associated with the current remediation scenario and determine return on investment (ROI) and internal rate of return (IRR) for the products over time. As noted above, the products that are associated with a remediation scenario may be selected from a database of products that are approved by the homeowner's utility company, or are available/preferred for installation in view of the contractor that will be performing the improvement work and/or the location of the home. Accordingly, this database can be accessed to retrieve material and labor cost breakdowns for qualifying products. This cost information can then be compared with the energy savings calculated at block 3314 to allow for ROI and IRR calculations.

At block 3318, process 3300 can return to block 3302 and blocks 3302-3316 can be repeated for each additional simulation scenario. Thus, process 3300 can loop until the output data for all of the simulation runs have been post-processed and converted. In alternative embodiments, blocks 3302-3316 can be run in parallel for all of the simulation scenarios executed in FIG. 32, thereby reducing the total time need for post-processing and output conversion. Once all of the simulation runs have been processed, home energy audit application 106 can generate a report for presentation to a customer of the audit (block 3320). This report can include, e.g., a summary of some or all of the input data received via user interfaces 400-3000, a summary of where energy is being spent/lost in the home (including breakdowns by living area/room, components, etc.), a summary of potential improvements (including specific products) that can be made to improve the energy efficiency of the home, and the costs and ROI/RRI values associated with those improvements/products.

In one embodiment, the customer of the audit may be the homeowner. In this case, the report may be tailored to focus on the operational energy ratings of the home (i.e., energy expenditure based on the homeowner's specific behavior and past usage), and to identify the upgrades that can be implemented to provide the most energy savings at the least cost.

In other embodiments, the customer of the audit may be a third party, such as the utility company or a regulatory agency. In these cases, the report may be tailored to focus on the asset energy ratings on the home (i.e., energy expenditure based on default usage habits), and to identify the potential energy savings for specific components that the third party is interested in. For example, a utility company may provide an incentive or rebate to homeowners who install a high efficiency water heater. However, the company may require proof that the installation of such a water heater will result in a certain percentage reduction in energy use. The report generated at block 3320 can be tailored to provide this information, and thus can be used as a type of certification that is provided to the utility company to take advantage of the incentive/rebate.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. For example, although certain embodiments have been described with respect to particular process flows and steps, it should be apparent to those skilled in the art that the scope of the present invention is not strictly limited to the described flows and steps. Steps described as sequential may be executed in parallel, order of steps may be varied, and steps may be modified, combined, added, or omitted. As another example, although certain embodiments have been described using a particular combination of hardware and software, it should be recognized that other combinations of hardware and software are possible, and that specific operations described as being implemented in software can also be implemented in hardware and vice versa.

The specification and drawings are, accordingly, to be regarded in an illustrative rather than restrictive sense. Other arrangements, embodiments, implementations and equivalents will be evident to those skilled in the art and may be employed without departing from the spirit and scope of the invention as set forth in the following claims.

What is claimed is:

1. A method comprising:
   receiving, by a computer system from a user, a plurality of user inputs related to an energy audit of a home, the plurality of user inputs including one or more two-dimensional layouts of the home;
   converting, by the computer system, the plurality of inputs into input data appropriate for consumption by an energy simulation engine, the converting comprising generating a three-dimensional model of the home based on the one or more two-dimensional layouts; and
   executing, by the computer system via the energy simulation engine, multiple energy simulations of the home in parallel based on the input data, the multiple energy simulations including a base scenario and a plurality of remediation scenarios, each remediation scenario corresponding to a different modification of the base scenario for improving energy efficiency of the home in a specific area.

2. The method of claim 1 wherein the plurality of user inputs further include construction surface descriptions for a plurality of construction elements, the plurality of construction elements including windows, doors, walls, ceilings, floors, and skylights.

3. The method of claim 2 wherein the one or more two-dimensional layouts are specified using the construction surface descriptions.

4. The method of claim 3 wherein generating the three-dimensional model comprises assigning a construction surface description to each surface of the three-dimensional model based on the one or more two-dimensional layouts.

5. The method of claim 4 wherein the converting further comprises, for each construction surface description assigned to a surface of the three-dimensional model, transforming user inputs pertaining to the construction surface description into physical properties based on the ASHRAE Handbook of Fundamentals.

6. The method of claim 1 wherein the plurality of user inputs further include, for each room in the home, lighting information, plug load information, and appliance information.

7. The method of claim 6 wherein the appliance information includes a make and model of a household appliance, and wherein the computer system is configured to access an appliance database to determine technical specifications for the household appliance.

8. The method of claim 6 wherein the converting further comprises generating electrical models for the home based on the lighting information, the plug load information, and the appliance information.

9. The method of claim 1 wherein the plurality of user inputs further include air infiltration results collected via a blower door test and duct leakage data collected via a duct blaster test.

10. The method of claim 9 wherein the converting further comprises converting the air infiltration results into leakage areas for calculation with stack coefficients and wind coefficients.

11. The method of claim 1 wherein the plurality of user inputs further include information regarding mechanical equipment installed in the home, the mechanical equipment including heating equipment, cooling equipment, water heaters, and pool pumps.

12. The method of claim 11 wherein the converting further comprises generating a data object for each piece of mechanical equipment based on specifications retrieved from an equipment specifications database.

13. The method of claim 1 wherein the plurality of user inputs further include historical energy bill data for an owner of the home.

14. The method of claim 13 wherein the converting further comprises generating operational schedules for appliances and mechanical equipment in the home.

15. The method of claim 14 wherein the operational schedules are based, at least in part, on the historical energy bill data.

16. The method of claim 1 further comprising:
   receiving output data from the energy simulation engine in response to the executing; and
   converting the output data into customer facing data.

17. The method of claim 16 wherein converting the output data into customer facing data comprises determining, for every hour of a simulated year, total energy expenditure values, in terms of electricity and fuel, for each of the following components:
   heating equipment, cooling equipment, heating blower, cooling blower, water heater, lights, appliances, plug loads, pool pumps, and water pipes.

18. The method of claim 17 wherein converting the output data into customer facing data further comprises scaling the total energy expenditure values against historical energy bill data for an owner of the home.

19. The method of claim 16 wherein converting the output data into customer facing data comprises determining, for every hour of a simulated year, Time Dependent Value (TDV) source values for electricity and fuel.

20. The method of claim 16 wherein converting the output data into customer facing data comprises determining demand values representing maximum power expenditure for the home per month.

21. The method of claim 16 wherein converting the output data into customer facing data comprises calculating duct system losses.

22. The method of claim 16 wherein converting the output data into customer facing data comprises, for each remediation scenario, calculating prices and return on investment (ROI) of products associated with the remediation scenario.

23. A non-transitory computer readable medium having stored thereon program code executable by a computer system, the program code comprising:
   code that causes the computer system to receive from a user a plurality of user inputs related to an energy audit of a home, the plurality of user inputs including one or more two-dimensional layouts of the home;
   code that causes the computer system to convert the plurality of inputs into input data appropriate for consumption by an energy simulation engine, the converting comprising generating a three-dimensional model of the home based on the one or more two-dimensional layouts; and
   code that causes the computer system to execute, via the energy simulation engine, multiple energy simulations of the home in parallel based on the input data, the multiple energy simulations including a base scenario and a plurality of remediation scenarios, each remediation scenario corresponding to a different modification of the base scenario for improving energy efficiency of the home in a specific area.

24. A system comprising:
a processor configured to:
- receive from a user a plurality of user inputs related to an energy audit of a home, the plurality of user inputs including one or more two-dimensional layouts of the home;
- convert the plurality of inputs into input data appropriate for consumption by an energy simulation engine, the converting comprising generating a three-dimensional model of the home based on the one or more two-dimensional layouts; and
- execute, via the energy simulation engine, multiple energy simulations of the home in parallel based on the input data, the multiple energy simulations including a base scenario and a plurality of remediation scenarios, each remediation scenario corresponding to a different modification of the base scenario for improving energy efficiency of the home in a specific area.

* * * * *